Nov. 30, 1965 J. A. EVANS ETAL 3,220,331

CONTACT PRINTING MASK ALIGNMENT APPARATUS FOR SEMICONDUCTOR WAFER GEOMETRY

Filed Jan. 27, 1965 11 Sheets-Sheet 1

INVENTORS.
JAMES A. EVANS
HENRY TANCREDI
FREDERICK W. KULICKE, JR.
BY
Bither & Mayeman
ATTORNEYS.

INVENTORS.
JAMES A. EVANS
HENRY TANCREDI
FREDERICK W. KULICKE, JR.
BY
Belker & Moyerman
ATTORNEYS.

INVENTORS.
JAMES A. EVANS
HENRY TANCREDI
FREDERICK W. KULICKE, JR.
BY
Bilher & Moyerman
ATTORNEYS.

INVENTORS.
JAMES A. EVANS
HENRY TANCREDI
BY FREDERICK W. KULICKE, JR.
Bilher & Moyerman
ATTORNEYS.

INVENTORS.
JAMES A. EVANS
HENRY TANCREDI
BY FREDERICK W. KULICKE, JR.
Bilher & Mayerman
ATTORNEYS.

INVENTORS.
JAMES A. EVANS
HENRY TANCREDI
BY FREDERICK W. KULICKE, JR.
Zelber & Mozerman
ATTORNEYS.

INVENTORS.
JAMES A. EVANS
HENRY TANCREDI
BY FREDERICK W. KULICKE, JR.
Bilker & Mozerman
ATTORNEYS.

INVENTORS.
JAMES A. EVANS
HENRY TANCREDI
BY FREDERICK W. KULICKE, JR.
Belker & Nogeman
ATTORNEYS.

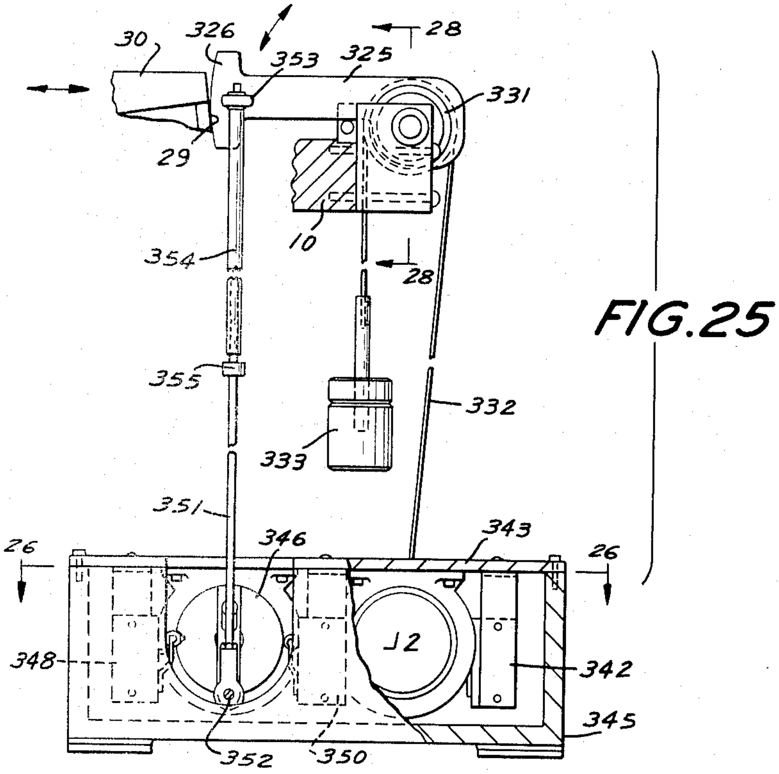
FIG. 25
FIG. 26
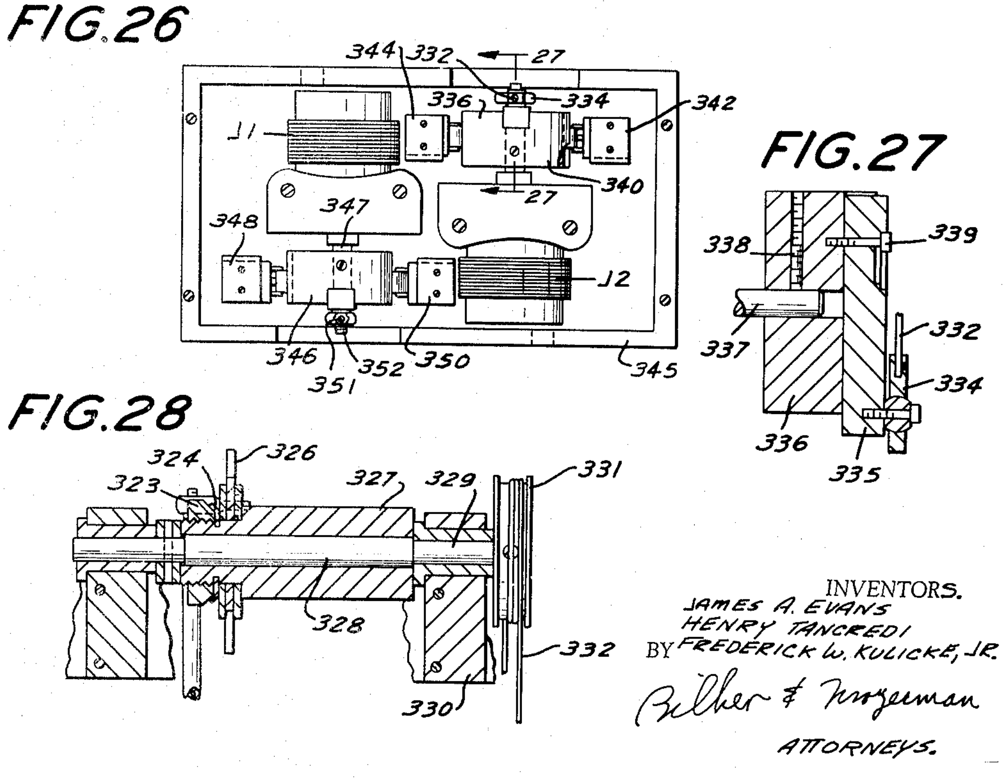
FIG. 27, FIG. 28
INVENTORS.
JAMES A. EVANS
HENRY TANCREDI
BY FREDERICK W. KULICKE, JR.
Bilber & Mozeman
ATTORNEYS.

INVENTORS.
JAMES A. EVANS
HENRY TANCREDI
BY FREDERICK W. KULICKE, JR.
Bilker & Moyerman
ATTORNEYS.

Nov. 30, 1965 J. A. EVANS ETAL 3,220,331

CONTACT PRINTING MASK ALIGNMENT APPARATUS FOR SEMICONDUCTOR WAFER GEOMETRY

Filed Jan. 27, 1965 11 Sheets-Sheet 11

INVENTORS.
JAMES A. EVANS
HENRY TANCREDI
BY FREDERICK W. KULICKE, JR.
Bilher & Moyerman
ATTORNEYS.

3,220,331
Patented Nov. 30, 1965

3,220,331

CONTACT PRINTING MASK ALIGNMENT APPARATUS FOR SEMICONDUCTOR WAFER GEOMETRY

James A. Evans, Henry Tancredi, and Frederick W. Kulicke, Jr., Philadelphia, Pa., assignors to Kulicke and Soffa Manufacturing Company, Fort Washington, Pa., a corporation of Pennsylvania Filed Jan. 27, 1965, Ser. No. 428,494
15 Claims. (Cl. 95—73)

This invention relates to a contact printing apparatus for precisely orienting a pattern of geometric indicia on a mask with respect to co-related geometric indicia on the surface of a semiconductor wafer. More particularly, this invention is directed to a means for successively transferring intelligence, known as geometry, to semiconductor wafers or microcircuit substrates by a series of photographic overlays in a predetermined sequence whereby each pattern may be combined on the semiconductor devices in accurate registration with previously incorporated indicia.

In the fabrication of transistor and microcircuit devices, it has become the practice to evaporate or diffuse electrodes and other microelectronic components for transistors and microcircuits through etched-away apertures in films or coatings which have been photofabricated on the surface of such semiconductor wafers or slabs. From as few as four photoresist masking films, in the case of a simple transistor, to as many as perhaps twenty-five separately-applied photosensitive resist coatings, in the case of microcircuitry, are successively transferred from a sequenc of master masks in order to define and produce the ultimate semiconductor geometry. Each mask pattern must be contact printed upon the next preceding design or element on the semiconductor wafer with most exacting alignment precautions to assure registration of the series of components on the semiconductor surface. For example, the individual indicia may have dimensional outlines which do not exceed a few ten thousandths of an inch and may be spaced from each other by the same order of magnitude. The problem may be easily recognized by understanding the difficulty in successively evaporating overlying plates of a capacitor upon a microcircuit substrate with a dielectric therebetween occupying a rectangular area of perhaps one mil by two mils without the plates shunting with each other or to a next adjacent electrode. Note also that the indicia that is finally patterned upon the semiconductor may be formed from many different metals and non-metals in order to accord the semiconductor device with the desired microelectronic characteristics.

The details of the patterns are usually scribed, etched or microphotographed on the surface of highly-polished, optically-flat glass master masks or reticles. During photographic transfer of the master patterns on the mask to the semiconductor wafer surface, the two surfaces must be in intimate contact in order to preclude distortions or other aberrations. However, it is first necessary to orient the two surfaces so that the overlying geometric patterns register before the contact printing may be performed. Painstaking care must be taken to superimpose the mask pattern with the geometric indicia already incorporated on the semiconductor wafer. The alignment is accomplished by relatively manipulating the two surfaces with respect to each other not only along rectilinear X- and Y-axes but also about a polar axis as well. Since the manipulation of the patterns into registration cannot be conducted while the surfaces are in contact with each other, the registration is performed while the two surfaces are in adjacently spaced planes. All of this is done under microscope observation, a high-powered stereo microscope usually being used to scan remotely spaced areas of the two geometric patterns in order to assure that the total configuration of both indicia are in complete registration along rectilinear and polar directions.

Since the depth of the field of a high-powered microscope is relatively short, in the vicinity of possibly 2 to 3 thousandths of an inch, the two planes which are being observed (the mask reticle plane and the wafer surface plane) must be in precise parallel disposition with respect to each other. The spacing of these two surface planes must also be quite small (less than .001 inch) so that the two overlying geometric patterns can be compared with each other under high-powered magnification. Finally, after the two patterns have been superimposed into accurate spaced registration with each other, there must be means to retain the already accomplished precise alignment in order to assure verification of the two patterns when they are returned into abutment with each other preparatory to contact printing.

Furthermore, the actual photographic transfer of the image from the mask to the semiconductor wafer must be performed under conditions which will yield photographic images of consistent quality whereby reproductions can be duplicated upon successive wafers. Light exposure must be constant across the entire contact printing surface in order that uniform image quality is effected over the entire area of reproduction. This requires precision collimation of the exposure lamp system together with the need for consistency in shutter exposure rate. The latter requires that a uniform and consistent shutter traverse can be provided. In addition, during all phases of the contact printing procedure, there is the need to maintain the planes of the two surfaces in perpendicular disposed relationship with the axis of the microscope and the axis of collimation of the lamp exposure system.

It is therefore an object of this invention to provide a mask alignment fixture for rapidly and accurately positioning mask patterns with respect to semiconductor wafer indicia preparatory to contact printing.

Another object of this invention is to construct a mask alignment apparatus which can provide the optimum degree of resolution required to deliver a high production rate of transistor and microcircuit devices.

Another object of this invention is to provide a self-aligning surface-contacting system whereby compensation is automatically provided for variations in semiconductor wafer thickness.

Still another object of this invention is to provide a contact printing mask alignment apparatus wherein the two surfaces bearing the patterns can be automatically oriented into parallel spaced planes.

Yet another object of this invention is to provide a mask alignment system wherein all motions are smooth and precise with zero backlash and play.

A further object of this invention is to provide a contact printing mask alignment system in which face-to-face verification is assured after the two surfaces bearing the geometric patterns are manipulatively oriented into registration.

A still further object of this invention is to provide a contact printing mask alignment instrument which will accurately reproduce and transfer images from a series of master masks to semiconductor wafer surfaces.

Other objects of this invention are to provide an improved device of the character described that is easily and economically produced, which is sturdy in construction, and which is highly efficient and effective in operation.

With the above and related objects in view, this invention consists of the details of construction and combination of parts as will be more fully understood from the following detailed description when read in conjunction with the accompanying drawings, in which:

FIGURE 25 is a sectional view taken along lines 25—25 of FIGURE 2.

FIGURE 26 is a sectional view taken along lines 26—26 of FIGURE 25.

FIGURE 27 is a sectional view taken along lines 27—27 of FIGURE 26.

FIGURE 28 is a sectional view taken along lines 28—28 of FIGURE 25 .

Figures 7, 8, 9:
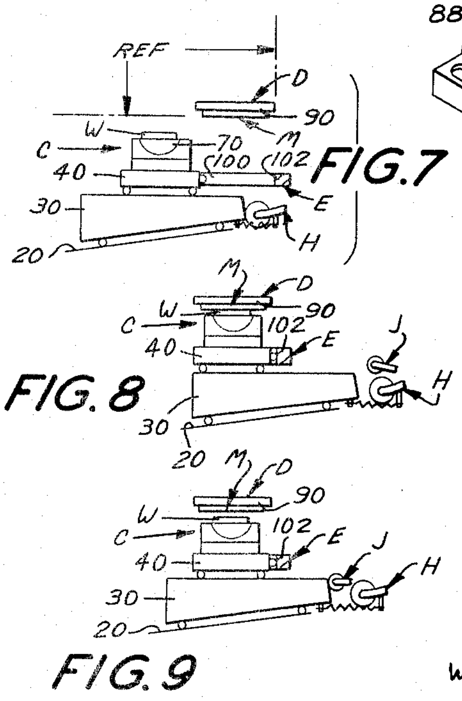
FIGURE 7 is a side elevational schematic view which generally demonstrates the initial loading step in the sequence of operations involving the inclined plane elevating mechanism of the instant invention.
FIGURE 8 is a schematic view showing the second step in the operation of the inclined plane mechanism wherein the wafer is clamped against the mask to orient the abutting surfaces in parallel planes.
FIGURE 9 is a schematic view showing the third step in the sequence of operations in which the mask and wafer surfaces are adjacently separated from each other while retaining the planes thereof parallel so that the indicia on the wafer can be manipulated along X-, Y- and polar-axes into registration with the mask geometry.

Referring now in greater detail to the drawings in which similar reference characters refer to similar parts, we show a contact printing mask alignment system comprising a primary frame, generally designated as A, a base assembly B constituting an inclined plane for vertically reciprocating a semiconductor wafer W into and out of face-to-face abutment with a mask M, a wafer chuck assembly C, a mask supporting assembly D, a micromanipulator E for precisely orienting the wafer chuck rectilinearly in a horizontal plane, a microscope assembly F for scanning under high-powered magnification the dispositon of the mask pattern with respect to the wafer geometry, a light exposure assembly G, and a drive assembly H for automatically actuating the movement of the inclined plane reciprocation mechanism. The initial steps in the sequence of operations are best shown in FIGS. 7, 8, 9 and 13. In FIG. 7, mask M mounted in holder 90 is inserted in support assembly D and vacuum clamped in a reference plane spanning the inclined plane base B. Wafer W is vacuum clamped to top of ball chuck 70 supported as a universal joint in carriage 40. Carriage 40 is horizontally slidable upon wedge 30. In FIG. 8, wedge 30 is pulled up inclined plane by drive assembly H until wafer W abuts the mask M. When plane-parallel interfacial engagement is accomplished (ball joint self-aligns), depressor J automatically retracts wedge 30 a small distance down inclined base so that the mask and wafer patterns are adjacently spaced in parallel planes. See FIG. 9. The two patterns are now brought into registration by manipulator E and carriage rotary positioner. See FIG. 13. Depressor J is then released thereby returning the two verified patterns into registering abutment preparatory to contact printing.

Figure 1:
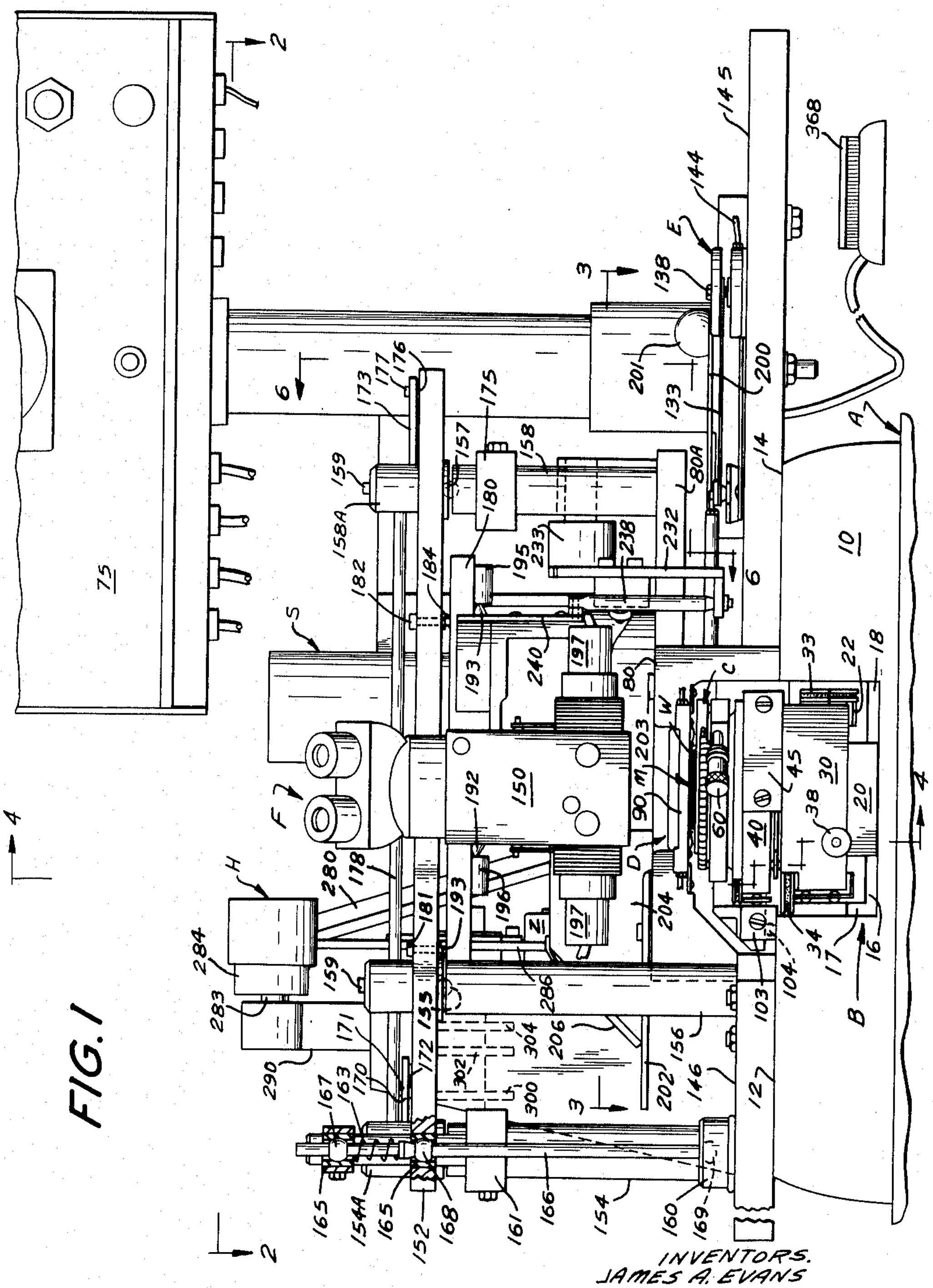
FIGURE 1 is a front elevational view, and partly in section, of a mask alignment fixture for orienting and contact printing geometric indicia upon the surface of a semiconductor device.
Figure 2:
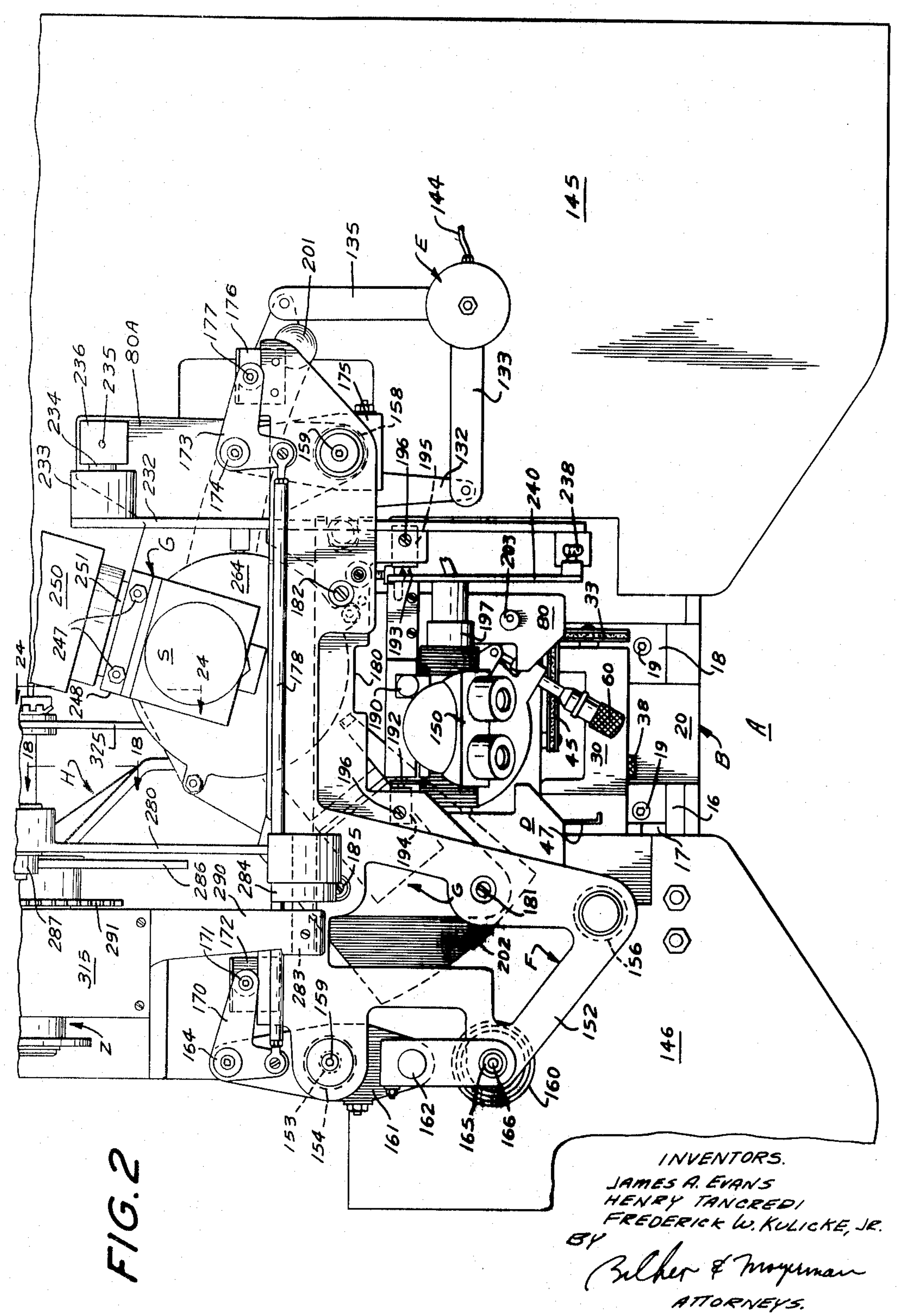
FIGURE 2 is a top plan view thereof taken along lines 2—2 of FIGURE 1.
Figures 4, 4A:
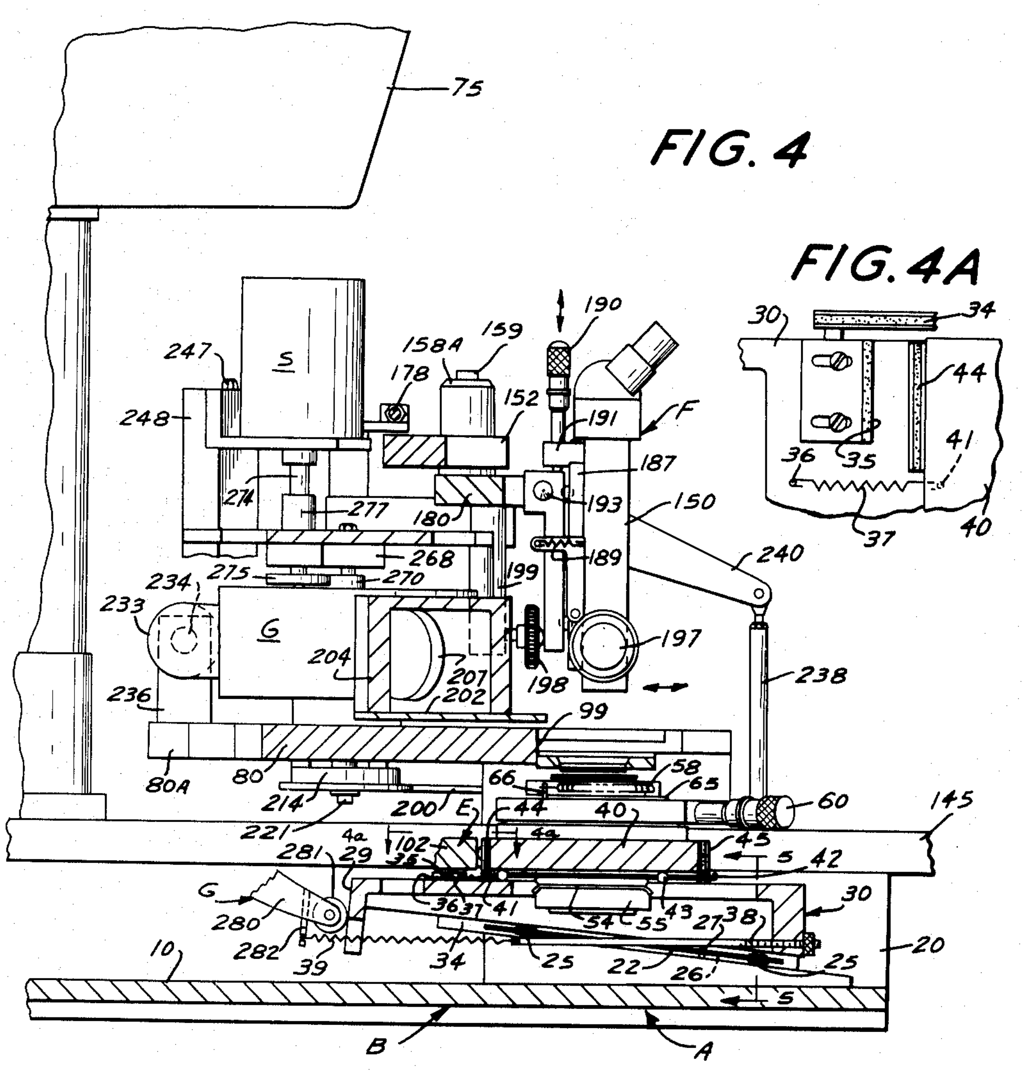
FIGURE 4 is a sectional view taken along lines 4—4 of FIGURE 1.
FIGURE 4A is a sectional view taken along lines 4A—4A of FIGURE 4.

The frame A comprises a rigid foundation in the form of a work bench which is adapted to support the entire contact printing alignment apparatus at convenient table top level and stabilize the instrument against vibration and shock. As shown in FIGURES 1, 2 and 4, the base assembly B, which actually constitutes a frame in itself, rests upon the top of the work bench and may be secured thereto, if desired, by suitable bolts. The base assembly B includes a large cast pedestal 10 upon which the remainder of the apparatus is supported. An inclined plane channel 20 longitudinally extends through the pedestal 10 intermediate left and right platforms 12 and 14. Both the channel 20 and the top surfaces of the platforms 12 and 14 are machined and ground with respect to each other in order to establish preliminarily tentative planes of base reference for the alignment operations.

Laterally spaced rails 16 and 18 are secured to the floor of the channel 20 by screws 19 which are recessed within counterbored holes therein. The rails 16 and 18 slope upwardly from the front to the rear of the channel 20 at an angle approximating 10°. Wedge slider plate 30 rides back and forth upon the inclined plane trackway defined by the sloped rails as impelled by drive assembly H. The upper and lower surfaces of the wedge 30 are ground and lapped with respect to each other so that they include an angle exactly equal to the slope of the inclined plane trackway 20. Slidably supported upon the upper surface of the wedge 30 is a carriage 40 which carries the wafer chuck assembly C.

In order to minimize friction during the fore-and-aft excursion of the wedge 30, within the inclined plane trackway 20, ball skates 21 and 22 are interposed between the lower runners 31 and 32 of the wedge and the respective rails 16 and 18. See FIGURES 1, 4 and 5. Skate 21 is L-shaped in cross section and has a pair of flanges which are oriented substantially perpendicular to each other. Balls 23 are rotatably retained within longitudinally spaced plastic grommets adjacent each end of the horizontal flange while balls 24 are similarly disposed in grommets mounted adjacent each end of the vertical flange. Skate 22 is an elongated flat strip ball carrier and contains spaced rotatably supported balls 25 adjacent each end. As shown in FIGURE 4, skate 22 has an elongated slot 26 which is intermediate the balls 25 and is engaged by a guide pin 27 upstanding from rail 18 so as to limit the skate's travel. An identical slot and guide pin arrangement (not shown) in the horizontal flange of skate 21 is also provided so as to restrict the latter's movement on the rail 16.

Figure 5:
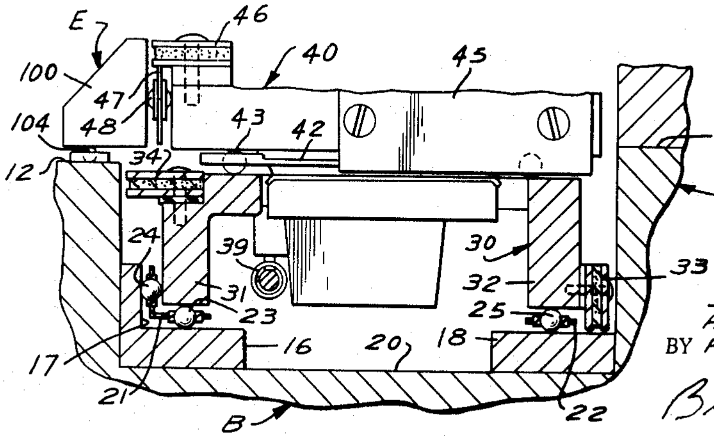
FIGURE 5 is a sectional view taken along lines 5—5 of FIGURE 4.

A strip magnet 33 is secured along the vertical wall of the right runner of the wedge 30, as shown in FIGURES 1, 2 and 5, and cooperates with the weight thereof in drawing the runner 32 down into glidable contact with the balls 25 of skate 22. Strip magnet 34 is horizontally disposed adjacent the upper surface of the wedge 30 adjacent the left runner 31 and draws the wedge and the sandwiched balls 24 of skate 21 into glidable contact with vertically disposed track 17, the latter being oriented at right angles to rail 16. The strip magnets 33 and 34 cooperate with each other in preventing canting of the wedge slider 30 as it is longitudinally reciprocated along the inclined plane trackway with a smooth gliding action over the sandwiched ball skates.

A bumper 35 is secured to the upper surface of the wedge 30 adjacent the rearward edge thereof. See FIGURES 4 and 7. Also upstanding from the rearward edge of the wedge 30 is a hanger pin 36 to which one end of a coil spring 37 is secured, the other end of the spring 37 being coupled to a hanger pin 41 downwardly depending from the carriage 40. The tension of the coil spring 37 normally biases the carriage 40 into abutment with the wedge bumper 35, as shown in FIGURE 7. Secured to the front wall of the wedge 30 and horizontally extending toward the rear thereof is a stud 38. A coil spring 39 connects the stud 38 with arm 200 of the drive assembly H whereby the rear wall of the wedge 30 is resiliently biased against roller 202. Movement of the drive arm 100 from right to left, as shown in FIGURE 4, moves the wedge slider 30 up the inclined plane trackway 20 in the same direction. The carriage 40 will follow the rearward stroke of the wedge slider until the carriage 40 is urged into abutment with a transversely extending (X-positioner) portion 100 of the micromanipulator E. At this stage, any further travel of the wedge 30 to the rear withdraws the bumper 35 from contact with the carriage 40 against the tension of spring 37. Of course, when the advancing rear wall of the carriage 40 once is urged into engagement with the micropositioner E, further advancement of the wedge merely causes the carriage to elevate along a pure vertical axis. Correspondingly, if the wedge slider 30 is retracted a slight distance down the inclined plane channel 20, so long as the carriage 40 is retained against the micropositioner E and withdrawn from contact with bumper 35, the carriage will be depressed along a pure vertical axis.

Referring now to FIGURES 1, 3, 4, 5 and 12, the carriage 40 is slidably supported in a horizontal plane on the top surface of the wedge 30 and glides frictionlessly thereupon on a ball carrier or skate 42. The skate 42 is a generally rectangular brass strip in which four balls 43 are rotatably retained adjacent each corner. Strip magnets 44 and 45 downwardly depend from the leading and trailing edges of the carriage 40 and cooperate with the weight of the entire wafer chuck assembly C in drawing the carriage into firm glidable contact upon the upper surface of the wedge slider 30 with the skate 42 sandwiched therebetween. The magnet 44 actually is the portion of the carriage which is adapted to abut either the wedge bumper 35 or the X-positioner portion of the micromanipulator E. The left hand edge of the carriage 40 also has a strip magnet 64 extending along the upper face thereof which draws the carriage into slidable contact with the inboard edge of the laterally extending (Y-positioner) portion 102 of the micropositioner E. A strip ball retainer 47 having longitudinally-spaced balls 48 rotatably supported in bearings therein is vertically oriented and sandwiched between the Y-positioner portion 102 and the left hand wall of the carriage.

Figure 3:
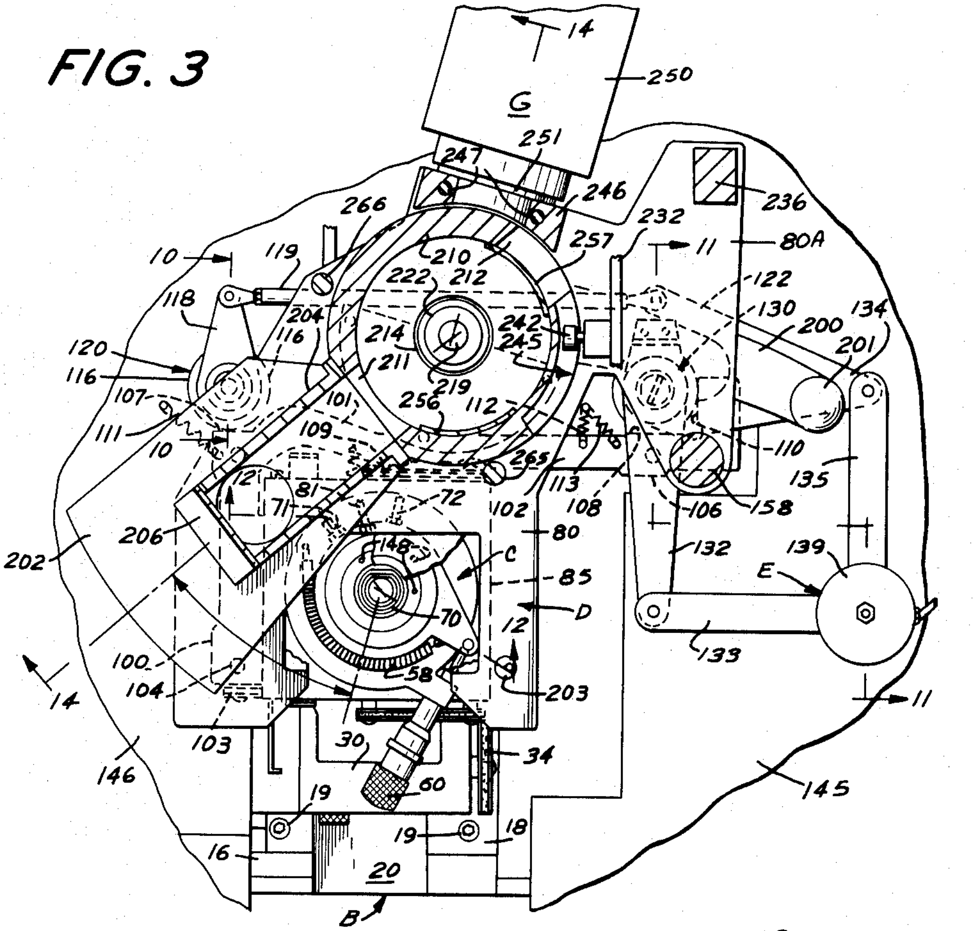
FIGURE 3 is a sectional view taken along lines 3—3 of FIGURE 1.
Figure 12:
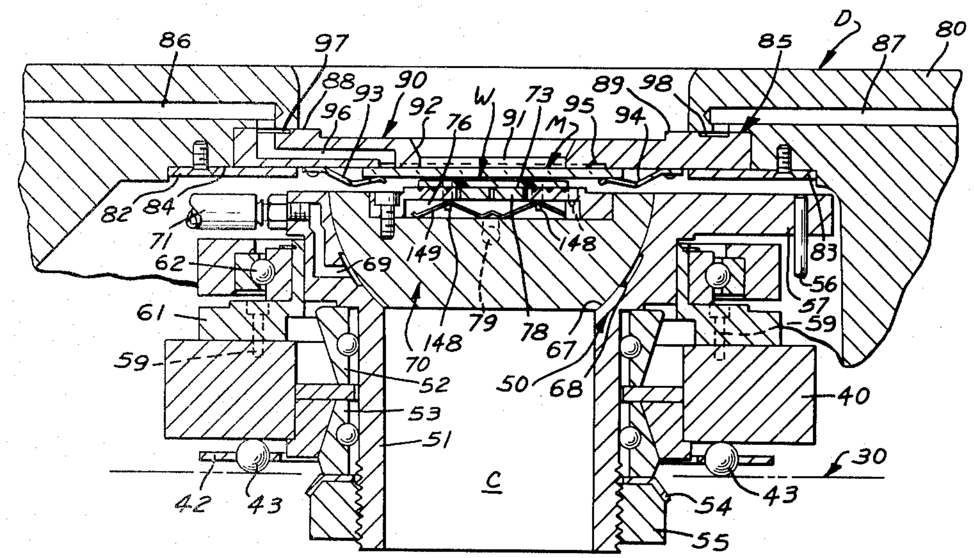
FIGURE 12 is a sectional view taken along lines 12—12 of FIGURE 3.

Referring now to FIGURES 3, 4 and 12, the wafer chuck assembly C includes a ball chuck housing 50 having a lower tubular portion 51 which is rotatably supported within a pair of taper roller bearings 52 and 53. Lock washer 54 and lock nut 55 secure both the roller bearings and the chuck housing within the carriage 40. Pin 56 downwardly projects from ear projection 57 at the periphery of the chuck housing 50. The pin 56 is resiliently urged in a clockwise direction by helical spring 58 into abutment with the spindle of polar axis adjusting micrometer 60. A socket member 61 is secured by screws 59 to the upper face of the carriage 40 annularly spaced about the housing 50. The inner race of single row ball bearing 62 is pressed around socket 61. A ring 64 which carries the micrometer 60 rides on the outer race of the bearing 62. Flat spring washer 65 is mounted between the hub of ring 64 and socket 61. This spring 65 provides a friction anchor for micrometer 60 to rotatably finely position the housing 50 by abutting pin 56 acting against the bias of coil spring 58 on hanger 66. In gross rotary positioning, the operator uses the micrometer 60 as a handle to rotate chuck housing 50 by slipping the micrometer ring 64 over the socket 61 and thus overcoming the friction of flat spring washer 65.

As may be readily seen in FIGURE 12, the upper central portion of the chuck housing 50 has a concave hemispheroidal surface 67 in the form of a cup. The cup 67 is lapped and polished so as to constitute a universal joint for supporting the complementary hemispherical surface of wafer ball chuck 70. A circular groove 68 is machined in the cup surface and communicates through port 69 with a flexible hose 71 coupled to a vacuum line actuated by a vacuum pump (not shown). A second port (not shown) interconnects the groove 68 with a second hose 72 (see FIGURE 3) which is coupled to a source of air under pressure. The hoses 71 and 72 are connected to solenoid actuated valves in frame console 75 which also contains other various pneumatic and electrical circuit components necessary for the operation of the present invention. These will be described in full detail in a subsequent portion of this specification. However, brief mention will now be made here to indicate that when air under pressure is introduced within the groove 68 through hose 72, the ball 70 will "float" on an interfacial stream of air so as to reduce the surface-to-surface friction of the universal joint. When vacuum is applied to the groove 68 through hose 71, the ball 70 will be locked in whatever configuration it has assumed in the universal joint cup 67.

A disk 73 is secured by screws 74 within a circular recess 76 at the upper flat portion of wafer chuck ball 70. Pressed within the central zone of the disk 73 is a sintered stainless steel insert 78. The insert 78 is porous and is ground and lapped flush with the upper surface of the disk 73, the latter having a plurality of concentric grooves 77 etched therein for centering the wafer W with respect to the chuck. The recess 76 under the disk 73 defines a vacuum chamber for sucking the wafer W into face-to-face contact with the upper surface of the disk through the foramina of the porous insert 78. A port 79 in the ball 70 interconnects the chamber 76 with tubing 81 that is coupled to a source of vacuum. See FIGURES 3 and 12.

Still referring to FIGURE 12 and to a lesser degree to FIGURES 1 and 4, the mask support assembly comprises a bridge 80 which is secured to the platforms 12 and 14 of the base pedestal 10 and spans the inclined plane guideway 20. A pair of plates 82 and 83 are screwed against a transom 84 in the bridge 80 and longitudinally extend from the front to the rear thereof in spaced relation from the roof thereof so as to define a slot guideway 85 for slidably receiving mask holder 90. Cannulae 86 and 87 which are connected to a vacuum or exhaust line are drilled in the bridge 80 from each side and terminate in orifices within the slideway roof 85, the roof being a reference plane which is lapped parallel with respect to the upper surface of the wedge slider 30.

Figure 13:
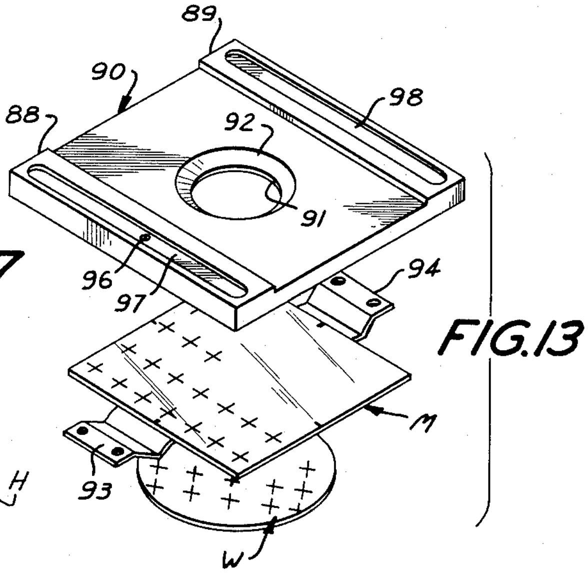
FIGURE 13 is a perspective view of the mask holder.

The mask holder 90 is generally of rectangular configuration, as illustrated in FIGURE 13, and includes a pair of upwardly extending shoulders 88 and 89 which are ground and lapped parallel with the under surface of the holder. The central portion of the holder 90 has a circular aperture 91 passing therethrough with a peripheral bevel 92. The bevel 92 reduces the likelihood of penumbral effects being created when a collimated beam of light from the exposure assembly G is directed through the aperture 91 against the mask pattern. Spring clips 93 and 94 resiliently retain the optically flat transparent mask M in slidable contact with the under surface of the holder 90. The mask pattern is centered with respect to the aperture 91 by aligning scribed reference lines (not shown) on the bottom surface of the holder with respect to similar indicia on the mask itself. This is a preliminary alignment procedure which assures accurate registration in the holder 90 for each successive mask M whose pattern is to be transferred to the wafer W. A circular groove 95 is also machined in the bottom surface of the mask holder 90 concentrically spaced about the aperture 91. The groove 20 has a diameter which is less than the plan dimensions of the mask M and is adapted to act as a vacuum chuck for positively clamping the mask into intimate face-to-face contact with the holder 90. A channel 96 in the holder 90 interconnects the groove 95 with a longitudinal recess 97 in the upper surface of shoulder 88. Shoulder 89 also has a longitudinal recess 98 in its upper surface. When the mask holder 90 with its mask M clipped thereto is inserted within the slideway 85 against a stop 99 at the back thereof, the recesses 97 and 98 register with the respective orifices 86 and 87 in the roof of slideway 85. Actuation of appropriate valves, which will be discussed hereinafter, causes the holder 90 to be drawn by vacuum into intimate clamped engagement with the roof of the slideway 85 by virtue of the reduced pressure within the recesses 97 and 98. The mask M itself is simultaneously locked in positive clamped engagement with the under surface of the holder 90 because of the reduced pressure within groove 95 acting through channel 96.

Referring now to FIGURES 1, 3, 10 and 11, the micromanipulator E comprises an L-shaped bracket 101 which includes the X- and Y-positioner arms 100 and 102. The bracket 101 has a ground and polished lower surface which is glidably supported on three single ball bearings 104, 105 and 106 triangularly disposed on the upper surface of pedestal 10 adjacent the channel 20. A strip magnet 103 is secured to the leading edge of arm 100 which draws the very end of this arm down into contact with ball 104 thereby precluding rocking of the bracket 101 on the ball surfaces. The Y-positioner arm 102 has a pair of vertically-disposed laterally-spaced pads or flats 107 and 108 at its rear wall. A third vertically-disposed flat 110 is formed on the toe of arm 102 adjacent flat 108 and oriented perpendicular thereto. Springs 111, 112 and 113 bias the flats 107, 108 and 110 into contact with eccentric positioning cams 120 and 130. See FIGURE 3.

Figure 11:
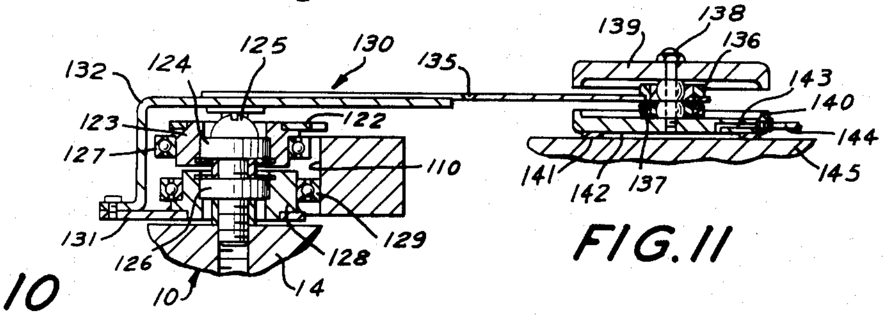
FIGURE 11 is a sectional view taken along lines 11—11 of FIGURE 3.
Figure 10:
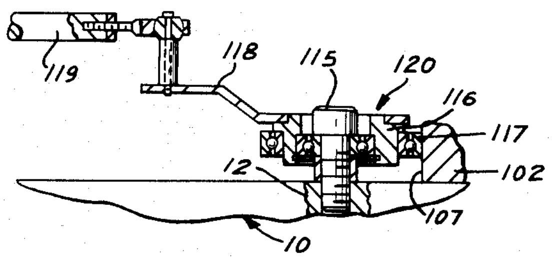
FIGURE 10 is a sectional view taken along lines 10—10 of FIGURE 3.

Referring to FIGURE 10, the positioner cam 120 includes an annular ball bearing 114 whose inner race is secured to stud 115 threadedly secured and upstanding from the rear portion of platform 12. An eccentric 116 is pressed about the outer race of bearing 114, and a second ball bearing 117 is annularly secured to the periphery of the eccentric 116. The circumference of bearing 117 is thus urged into contact with the flat 107 on positioner arm 102. An actuating finger 118 is secured to the eccentric 116. The end of finger 118 is further pivotally coupled to one end of connecting rod 119. The other end of connecting rod 119 is pivotally connected to actuating finger 122 which embraces eccentric 123 in positioner cam 130. As shown in FIGURE 11, eccentric 123 is secured about the outer race of annular ball bearing 124. The ball bearing 124 is vertically stacked over a second ball bearing 126, and both are supported by their inner races upon stud 125 threadedly secured to and upstanding from platform 114. An outer ball bearing 127 is secured to the periphery of eccentric 123, and its outer circumference is urged into contact with flat 108 on Y-positioner arm 102 in the same manner as ball bearing 117 engages flat 107 at the left hand portion. Thus, eccentrics 116 and 123 produce movement of the bracket 101 in a Y-direction (vertically with respect to the FIGURE 3 orientation on the sheet). An X-positioning eccentric 128 is pressed about the outer race of ball bearing member 126. The inner race of ball bearing member 129 is secured to the periphery of eccentric 128 so that its outer race bears against flat 110. Also secured to the eccentric 128 is a wrist member 131 to which is affixed actuating finger 132. The outboard end of actuating finger 132 is pivotally connected to one end of pantograph link 133. Projection 134 on finger 122 is similarly pivotally connected to one end of pantograph link 135. The distal ends of links 133 and 135 are secured to the outer races of single ball bearing members 136 and 137 which are vertically stacked upon and rotate freely about stud 138. The ball bearing members 136 and 137 are thus sandwiched between a finger piece 139 and a shoe 140. The shoe 140 is slidable upon a highly polished shelf 145 which is secured to the top of platform 14. The lower portion of the shoe 140 has an annular flat ridge 141 circumferentially extending about a suction chamber 142. A bored passageway 143 in the shoe 140 interconnects the suction chamber with a flexible hose 144 which is further coupled to the vacuum manifold through a positioner lock valve which will be more fully described hereinafter.

Thus, manipulation of the shoe 140 upon the surface of the shelf 145 will correspondingly move the bracket 101 in a horizontal plane upon its supporting balls 104, 105 and 106. Eccentrics 116 and 123 acting against flats 107 and 108 produce Y-motion in the bracket 101. Eccentric 128 acting against flat 110 moves the bracket 101 in an X-direction. The arm 100 against which the carriage 40 is always drawn by magnet 34 transmits such X-motion to the carriage. Similarly, when the wedge 30 is drawn up the inclined plane 20 by the drive assembly H, the carriage is drawn into abutment with a boss 109 which is medially disposed between the flats 107 and 108 on the forward portion of the Y-positioner 102. Accordingly, Y-motion in the bracket 101 is transmitted to the carriage 40. All of this is accomplished when the surface of the wafer W is adjacently spaced in parallel relationship from the surface of the mask M. When registration has been effected of the two patterns, the shoe 140 is locked as a suction cup upon the surface of the shelf 145 through the vacuum line 144, thereby retaining verification of the two patterns. Thereafter, the verified patterns are returned into abutting relationship whereby the light sensitive surface of the wafer W may be contact printed using the lamp exposure assembly G.

Referring now to FIGURES 1, 2 and 4, the scanning assembly F comprises a split-image stereo microscope 150 which is suspended directly over the mask support assembly D by a deck plate 152. The deck plate 152 is slidably supported in a horizontal plane on large balls 153, 155 and 157 which are pillowed in columns 154, 156 and 158 respectively. These columns are oriented in a triangular plan configuration so as to provide rigid subjacent support for the deck 152. Column 154 is secured directly to the rear portion of platform 12. Column 156 is mounted upon the forward portion of platform 12 adjacent the channel 20. Column 158 is secured to bridge truss member 80A situated above platform 14. A highly polished hard plastic shelf 146 is mounted upon the platform 12 between the columns 154 and 156. Left shelf 146 is identical to right shelf 145 and acts as a slidable rest for chessman slider piece 160 which is adapted to move the microscope 150 in X- and Y-directions in the same manner as shoe 140 orients the carriage 40 through the micromanipulator E. Levelling screws 159 are threaded within heads in the deck plate which are triangularly spaced thereon to correspond with the column spacing. The ends of the levelling screws 159 bear upon the upper periphery of the respective pillow balls 153, 155 and 157 and provide a means for adjusting the deck in a plane parallel to the surface of mask M.

Bracket 161 is secured to the medial portion of column 154 and carries a front post 162 and a rear post 164. Front post 162 has a collar block 165 which is cantilevered forwardly and acts as a top fulcrum for joystick manipulating rod 166. A heim bearing 167 couples the upper portion of manipulating rod 166 within the collar 165 and permits the rod to freely swivel therein. An identical heim bearing 168 is rotatably supported within an opening in the deck plate 152 and slidably embraces the manipulator rod 166 therebelow. Coil spring 163 encircled about rod 166 is compressively interposed between the heims 167 and 168 and provides "feel." A third heim bearing 169 is rotatably supported in the slider piece 160 and slidably embraces the lower portion of rod 166.

Thus, movement of the slider piece 160 on the surface of shelf 146 transmits a proportionately reduced movement on X- and Y-directions to the deck plate 152. However, in order to assure that the directional movement of the deck plate exactly follows the directional movement of the slider piece 160 stabilization of the deck 152 is required. Accordingly, a bell crank 170 is pivotally supported on rear post 164, and one arm of this bell crank is pivotally secured to a short dowel 171 upwardly extending from deck tab 172. A second bell crank 173 is pivotally hinged to the top of post 174 which is mounted in bracket 175 rearwardly projecting from a medial portion of column 158. One arm of the bell crank 173 is pivotally secured to dowel 176 which upstands from tab 177 affixed to the right hand rearward portion of the deck plate 152. An interconnecting turnbuckle 188 is pivotally secured at each end to the forwardly projecting arms of the bell cranks 170 and 173 whereby the deck plate 152 is triangularly located in synchronization with the movement of the slider piece 160.

A pallet 180 is suspended from the deck plate 152 and retained in spaced disposition below the medial portion thereof by shoulder screws 181 and 182. The screws 181 and 182 extend through apertures in the deck plate 152 and threadedly engage tapped holes in the pallet 180. Springs 183 and 184 encircle the respective screws and are compressed therebetween ,so as to urge the pallet 180 apart from the deck 152 whereby the pallet can be oriented in a horizontal plane about a heim coupling 185. In this regard, it is important to note that the microscope 150 utilizes twin objective lenses which have a very shallow depth of field. In order to insure "optical parallelism" between the microscope 150 and the work (mask M and wafer W) the axis of collimation of the scope must be oriented perpendicular to the plane of the work and maintained in constantly spaced disposition thereabove throughout the entire scanning range. This horizontal plane of reference of the deck 152 is established by suitable adjustment of levelling screws 159 on the balls 153, 155 and 157. Similarly, the pallet 180 is oriented parallel to the deck by suitable adjustment of screws 181 and 182 about the triangular heim fulcrum 185.

The microscope 150 itself is secured to slider bracket 187. Springs 186 resiliently urge the bracket 187 into face-to-face abutment with supporting stage member 188. The bracket 187 glides upon balls 189 which are sandwiched between suitable vertically extending raceways in the supporting stage 188 and the bracket. A micrometer 190 is secured in a clamp 191 at the upper portion of the bracket 187 so that the micrometer spindle bears against the heel of stage 188 thereby permitting vertical adjustment or focusing of the scope 150 with respect to the work. Outwardly extending from the upper side portions of the stage 188 are a pair of conically pointed trunnions 192 and 193. The points of the trunnions engage complementary journals at the inboard ends of cylinder blocks 194 and 195 affixed to the underside of pallet 180 by screws 196. Thus, the microscope 150 is hingedly supported in the pallet 180, the lower back surface of the supporting stage 188 resting against the center of thumb adjusting screw 198 which is in threaded engagement with leg member 199 downwardly depending from the pallet 180. Illuminator housings 197 are secured to the sides of the microscope 150 and contain lamps which direct light through the objective lenses in order to facilitate observation of the work through the eyepieces.

Referring now to FIGURES 1, 2, 4 and 6, it can be seen that the microscope 150 is directly situated over the channel 20 in order that the orientation of the mask and wafer patterns may be visually compared with each other under magnification. See FIGURE 9A. Thus, while the two patterns are adjacently spaced from each other in parallel planes, the ball chuck 70 is horizontally positioned along X- and Y-axes by the micromanipulator E and about a polar axis by the rotary positioner 60 until registration is completed—i.e. when the split images of two widely spaced portions of the mask and wafer patterns exactly register. Thereafter, the verified patterns are returned into abutting relationship in preparation for contact printing. At this stage, the microscope 150 is swung forwardly on its trunnions 192 and 193 and out of the way by hand crank 200 which simultaneously rotates the exposure assembly G into position above the mask M within the space previously occuplied by the microscope 150.

FIGURES 6, 14, 15 and 17 demonstrate the construction of the exposure assembly G and its mechanical coupling with the scanner assembly F and the mask support assembly D. The exposure assembly B comprises a flat fan-shaped plate 202 upon the upper surface of which is a tunnelled casing 204. A front surface mirror 206 is retained at 45° to the distal edge of the casing 204 by clips 205 and directs the light beam from the tunnel 207 downwardly through plate aperture 208 upon the mask M. The proximal edge of the casing 204 is secured to a turret 210 by screws 209 whereby the tunnel 207 is co-axial with diametrically opposed turret openings 211 and 212. The lower portion of the turret 210 has an annularly reduced neck 214 having a slot 213 extending through approximately 180° thereof. A bracket 216 having a semi-circular flange 217 and a collar portion 218 couples the turret 210 to the bridge 80. The collar 218 is inserted through slot 213 and is clamped about the central portion of shaft 219 with screw 220. The upper end of the shaft 219 is pressed within the inner race of ring ball bearing 222 whose outer race is seated within neck bore 223. The lower end of the shaft 219 is secured within the inner race of ring ball bearing 224 by screw 221, the head thereof bearing against washer 225. The outer race of ring ball 224 is thus drawn into seated engagement with the lower surface of the neck 214 and within its bore 223. The flange 217 of bracket 216 is affixed to the bridge 80 by screws 226 so that the turret 210 is rotatable inside a large hold 227 within the bridge. The hand crank 200 is secured to the bottom edge of the turret neck 214 by screws 228 and is adapted to swing the entire exposure assembly G into position.

Figures 6, 14, 15, 16:
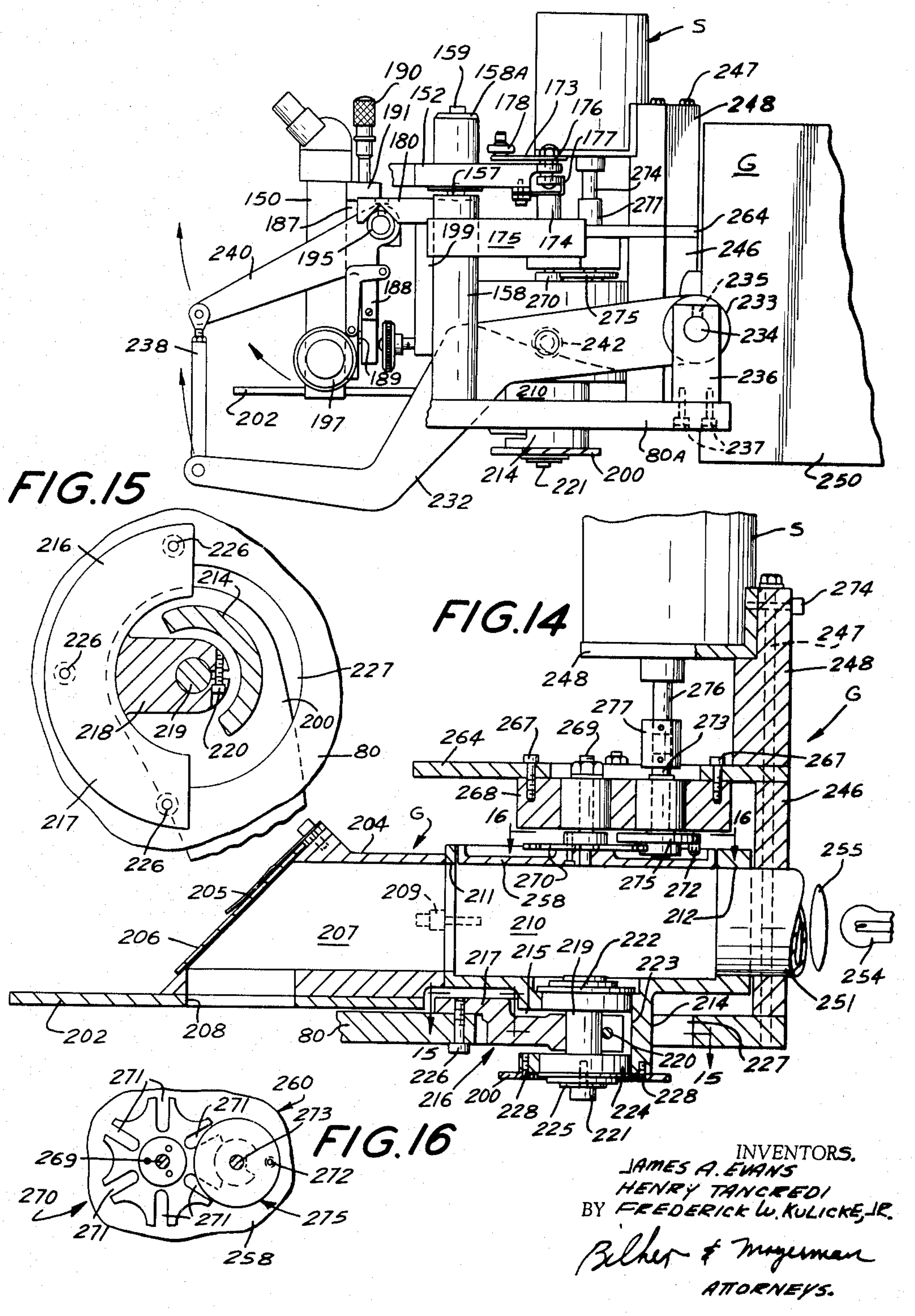
FIGURE 6 is a sectional view taken along lines 6—6 of FIGURE 1.
FIGURE 14 is a sectional view taken along lines 14—14 of FIGURE 3.
FIGURE 15 is a sectional view taken along lines 15—15 of FIGURE 14.
FIGURE 16 is a sectional view taken along lines 16—16 of FIGURE 14.
Figure 17:
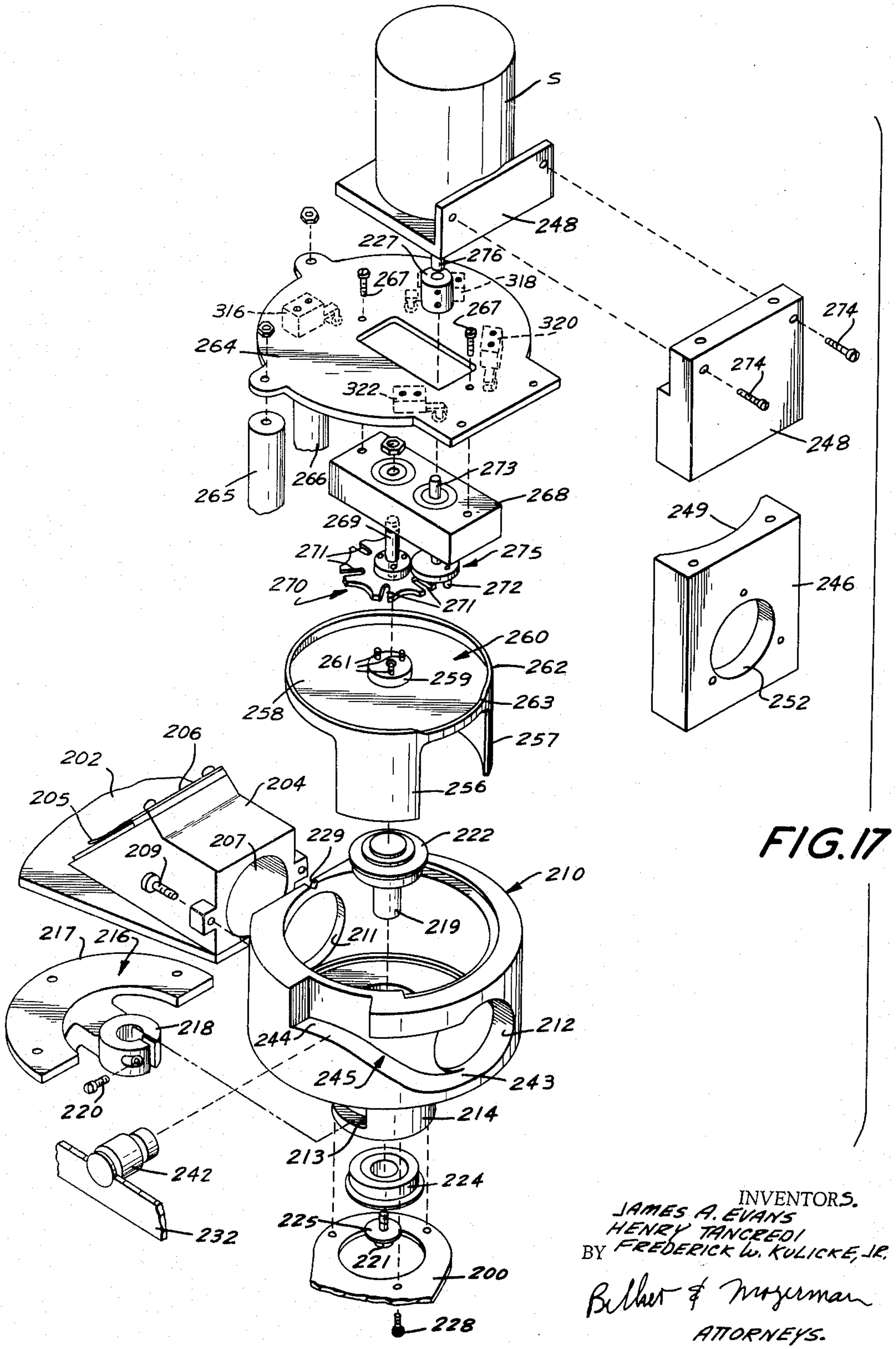
FIGURE 17 is an exploded perspective view of a light exposure housing and drive mechanism therefor.

The end of the crank 200 projects beyond the bridge truss 80A and has a knob 201 extending thereabove which is adapted to be grasped by the operator's right hand. Referring now to FIGURE 6, which is to be read in conjunction with FIGURE 17, there is illustrated a microscope actuating lever 232 which is adapted to swing the scope 150 into or out of position. The rearward end of the lever 232 situated at the right hand portion of FIGURE 6, has a large ring bearing 233 whose inner race carries a trunnion 234. The trunnion 234 is secured within a journal block 236 by set screw 235. The block 236 is affixed to the upper surface of bridge truss 80A by suitable mounting screws 237. The forward end of lever 232 is hingedly connected to one end of turnbuckle connecting rod 238. The upper end of connecting rod 238 is hingedly coupled to the leading end of actuating arm 240, the back edge of which is affixed to the miscroscope support stage 188. The medial portion of the lever 232 carries a cam follower 242 which rides within an arcuate cam guideway 245 formed within the cylindrical surface of the turret 210. When the cam roller 142 is at the lower portion 243 of the cam track 245 (lamp assembly G out of expose position), the actuating lever 232 is pivoted counterclockwise so that the microscope 150 is swung downwardly into scanning position. Conversely, when the lamp assembly G is rotated by hand crank 200 counterclockwise, as shown in FIGURE 17, into expose position (at which point the fan 202 abuts against stop 203 upstanding from the right hand portion of the bridge 80), the roller 242 rides up within the upper track portion 244 of the cam guideway 245. Accordingly, the actuating lever 232 is pivoted clockwise, as shown in FIGURE 6, so as to swing arm 240 and the microscope 150 upwardly out of position to make room for the tunnel casing 204.

Referring now to FIGURES 2, 3, 14 and 17, the rear portion of the bridge 80 has a pair of vertically stacked bracket blocks 246 and 248 which are secured thereto by long bolts 247. The inner surface of the bracket block 246 has an arcuate surface 249 which is adjacently spaced from the outer wall of turret 210. A lamp box 250 is secured to the block 246 by a projection tube 251 which is disposed about the block aperture 252. A mercury lamp 254 or other source of monochromatic light is placed at the focal point of projection lens 255 so as to direct a collimated beam of light through the tube 251. The tube 251 is co-axially aligned with the tunnel 207 and turret openings 211 and 212 when the fan 202 is rotated into "expose" position by crank 200.

As shown in FIGURE 17, a shutter 260 is rotatably supported within the interior of the turret 210 and has a pair of circumferentially spaced blades 256 and 257 downwardly depending from a disk portion 288. The boss 259 of shutter 260 is secured to the bottom of a Geneva wheel 270 by screws 261. A camming lip 262 having a depression 263 oriented directly above the space between the blades 256 and 257 is adapted to be engaged by the contact rollers of "shutter close" and "shutter open" microswitches 320 and 322 secured to the underside of mounting plate 264. The periphery of mounting plate 264 is secured at one edge between the vertically stacked bracket blocks 246 and 248 and at the other edge to a pair of circumferentially spaced posts 265 and 266 upstanding from the bridge 80. Also secured by screws 267 to the bottom of mounting plate 264 is a journal block 268 which rotatably supports shaft 269 of the Geneva wheel 270. The Geneva wheel 270 has six equally-spaced slots 271 radially extending to its periphery, one slot at a time being engaged by an eccentrically positioned pin 272 projecting downwardly from drive wheel 275. Shaft 273 of the drive wheel 275 is also rotatably supported in the journal block 268. A shutter drive motor S is supported by screws 274 upon the bracket block 248 above the mounting plate 264. The shaft 276 of drive motor S is directly connected to the shaft 273 of drive wheel 275 by sleeve coupling 277. As will be fully described hereinafter, the drive motor S, when it is actuated, turns the shutter 260 clockwise through drive wheel 275 and Geneva wheel 270 so that blade 256 is clear of the opening 212 and the collimated beam of light from lamp 254 can project through the tunnel 207. The motor S then is braked to a stop. After a preset exposure period, the shutter 260 is again rotated clockwise by motor S until the blade 257 intercepts and closes the aperture. The shutter rotation is at a constant speed and the trailing edge of blade 256 and the leading edge of blade 257 will respectively open and close the aperture from the same side. However, before passing to the construction of the main drive assembly H, it is to be observed that an "expose" and a "reset" microswitch 318 are also peripherally spaced on the underside of the mounting plate 264, the contact rollers of these microswitches being adapted to ride on the upper peripheral edge of the turret 219 and engage a V-notch 229 therein. The roller of "expose" microswitch 316 engages the notch 229 only when the turret 210 is rotated by crank 200 into "expose" position, the roller of "reset" microswitch 318 engaging the notch 229 only when the turret is rotated to swing the microscope 150 in scanning position.

Figures 18, 19, 20, 21, 22, 23, 24:
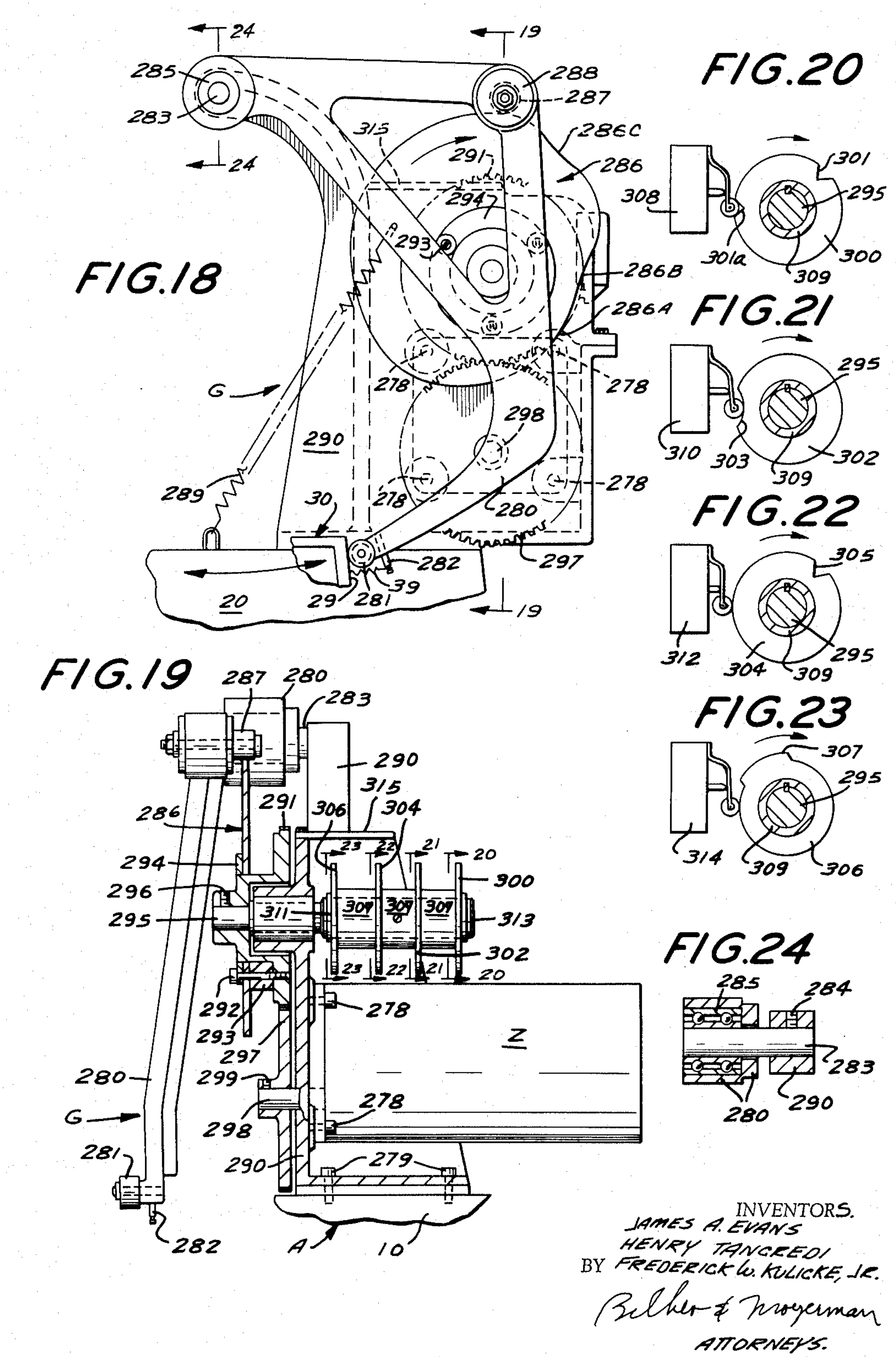
FIGURE 18 is a sectional view taken along lines 18—18 of FIGURE 2.
FIGURE 19 is a sectional view taken along lines 19—19 of FIGURE 18.
FIGURE 20 is a sectional view taken along lines 20—20 of FIGURE 19.
FIGURE 21 is a sectional view taken along lines 21—21 of FIGURE 19.
FIGURE 22 is a sectional view taken along lines 22—22 of FIGURE 19.
FIGURE 23 is a sectional view taken along lines 23—23 of FIGURE 19.
FIGURE 24 is a sectional view taken along lines 24—24 of FIGURE 19.

Referring now to FIGURES 18, 19, and 24, the main drive assembly H comprises a crank 280 which is pivotally supported at its upper end in base bracket 290. Roller 281 at the lower end of the crank 280 is biased into engagement with the rear inclined surface 29 of wedge 30. Hanger 282 downwardly depending from the crank 280 is coupled to the free end of drive spring 39 which is hooked at its other end to wedge stud 38. The pivot for the drive crank 280 includes a shaft 283 which is rotatably supported within the inner races of ring bearings 284 and 285, the outer races of which are pressed within respective eyelets in the crank 280 and bracket 290. Pivotal movement of this crank 280 is translated into horizontal reciprocation of the wedge slider 30, such pivotal movement being actuated by drive cam 286. The crank 280 has a follower roller 287 which is rotatably supported in eyelet bearing 288 and rests upon the upper periphery of the drive cam 286. Auxiliary spring 289 resiliently urges the crank 280 in a clockwise direction, as shown in FIGURE 18, in order to assure that the roller 287 will be in contact with and smoothly follow the cam 286 throughout its rotatable course.

The cam 286 is affixed to the hub of pinion gear 291 by screws 292 with spacer block 293 and stiffener disk 294 lending lateral support. The gear 291 is keyed to cam deck shaft 295 and is securely affixed thereto with set screw 296. Pinion gear 291 is in intermeshing engagement with main drive gear 297 which is keyed to motor shaft 298 and held thereon by set screw 299. The housing of the drive motor Z is coupled to the base bracket 290 by bolts 278, shoulder screws 279 being used to securely fasten the base bracket 290 to the bridge casting 80.

Referring now to FIGURES 19, and 20 to 23 inclusive, a series of automatic operation switch cams 300, 302, 304 and 306 are also keyed to the deck shaft 295 on the opposite side of the base bracket 290 from the main drive cam 286. The switch cams are axially spaced from each other by cylindrical separators 309 and maintained on the shaft 295 between medial collar 311 and end collar 313. Cam 300 actuates the drive motor and has a pair of circumferentially spaced V-notches 301 and 301*a* which are adapted to engage drive motor microswitch 308. Cam 302 controls the shutter motor S and has an arcuate notch 303 into which roller of shutter microswitch 310 falls. Cam 304 actuates the vacuum locking of the wafer W to the surface of the chuck 70 and has a V-notch 305 which is adapted to engage the roller of wafer lock microswitch 312. Cam 306 has a nose 307 and actuates ball lock microswitch 314 whereby vacuum may be applied to the peripheral groove 68 in the ball chuck cup 67. The microswitches 308, 310, 312 and 314 are secured to the underside of deck ceiling plate 315 which is mounted upon the top of base bracket 290. All of the cams 286, 300, 302, 304 and 306 rotate clockwise as shown in FIGURES 18 and 20 to 23, and are each shown in the position of contact printing. That is, drive cam 286 has rotated into the position which pivots the drive crank 280 to its maximum counterclockwise rotation so as to pull the wedge 30 by spring 39 to the rearmost position and up the inclined plane guideway 20. In FIGURE 29, all of the cams are shown in "loading" position preparatory to beginning the cycle of operations.

Referring now to FIGURES 25, 26, 27 and 28, the depressor assembly J comprises a foot member 325 which has an arcuate heel 326 for engaging the rear surface 29 of wedge slider 30. The actuating foot 325 is adapted to be pivoted counterclockwise, as shown in FIGURE 25, until the heel 326 is in abutment with the surface 29 and then moved to the left a predetermined small distance so as to drive the wedge 30 slightly down the inclined plane trackway 20 against the bias of the drive spring 39. The small distance which the wedge 30 moves down the inclined plane is sufficient to slightly lower the carriage 40 whereby the upper surface of the wafer W is adjacently spaced below the lower surface of the mask M, approximately .001 inch or less.

The proximal end of the depressor foot 325 is secured against the shoulder of a sleeve 327 by a nut 323 and lock washer 324. The sleeve 327 rotatably slides about the periphery of an eccentric drum bushing 328 which is pressed about shaft 329, the shaft 329 being journaled in cradle 330 which is affixed to the rear of pedestal 10. The outer surface of the eccentric drum 328 is approximately .005 inch out of round with respect to the axis of shaft 329. A pulley 331 is secured to one end of the shaft 329 and has a few turns of a cable 332 draped thereabout so as to suspend a weight 333. The other end of the cable 332 is secured to an eyelet bearing 334 which is pivotally supported in eccentric ring 335. Ring 335 is secured to bushing 336 which is affixed to shaft 337 of depressor motor J2 by set screws 338. Cam 340 is also secured to shaft 337 and has a V-notch which is adapted to engage microswitches 342 and 344. Both the depressor motor J2 and the microswitches 342 and 344 are secured to the lid 343 of housing 345 which rests on the floor behind the frame A.

Also secured to the lid 343 of the housing 345 is a depressor pivot motor J1. A cam 346 having a V-notch therein is secured to the pivot motor shaft 347 and is engaged by the contactor rollers of microswitches 348 and 350 suspended from the lid 343. A rod 351 is pivotally supported by its lower eyelet to a pin 352 which is eccentrically positioned in the surface of cam 346. The rod is slidably received within tube 354 having its upper end pivotally secured at 353 to the depressor foot 325. An exterior nut 355 is threaded upon a medial portion of the rod 351 which is adapted to abut and raise the lower end of the tube 354 when the rod is at the upper portion of its stroke. This raises the depressor foot 325 so as to pivot the heel 326 in a clockwise direction out of contact with the wedge surface 29, as shown in FIGURE 25. When the pin 352 is at the bottom of its rotary stroke, the rod 351 will lower within the tube 354, nut 355 retracting from contact with the lower edge of the tube as soon as the heel 326 "finds" the wedge surface 29. Thereafter, the foot 325 will reciprocate to the left by actuation of the eccentric drum 328 through pulley 331 and cable 332 as the depressor motor J2 rotates.

Figure 29A:
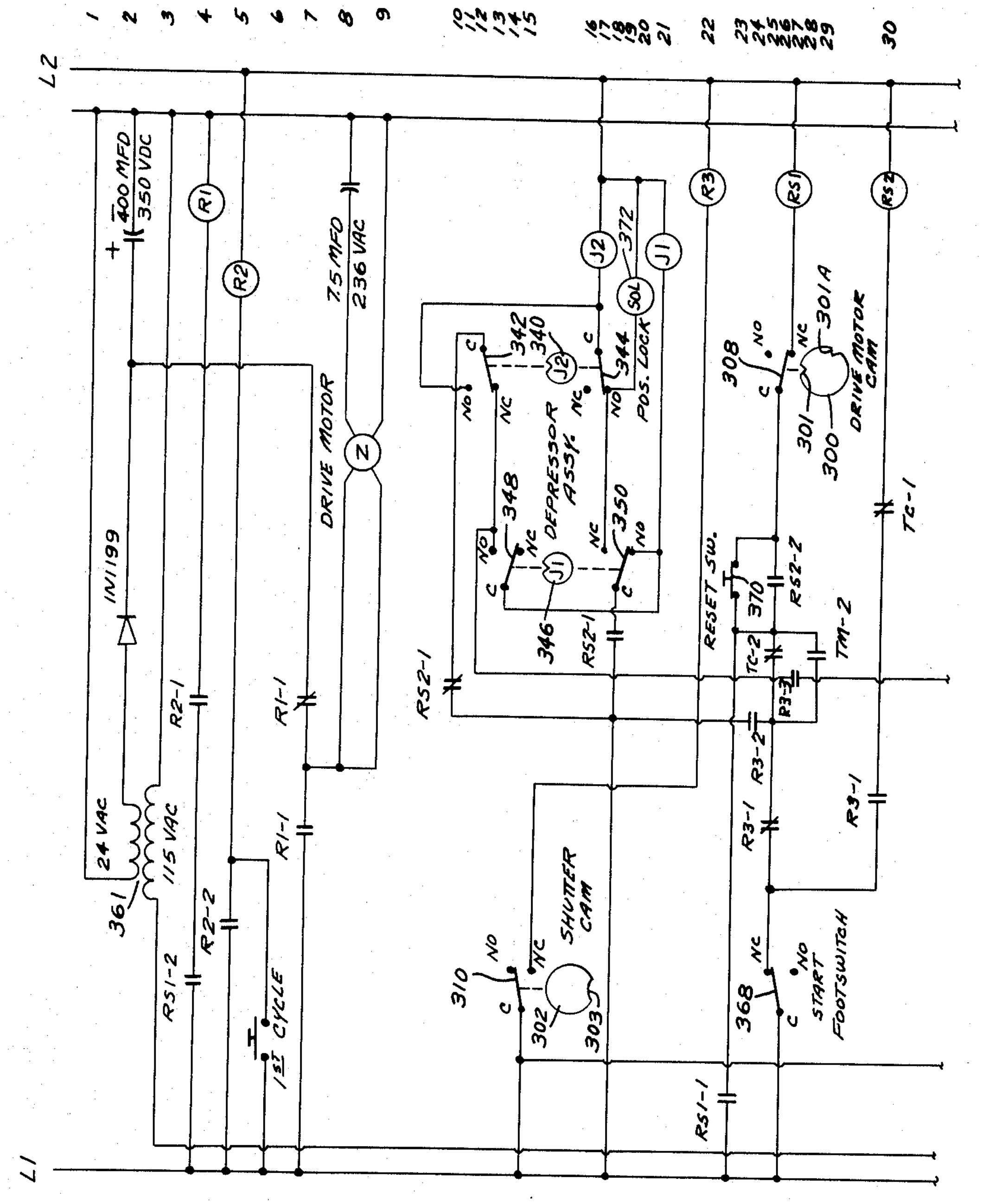
FIGURE 29 is an across-the-line schematic diagram of the electrical circuit components embodied in this invention.
Figure 29B:
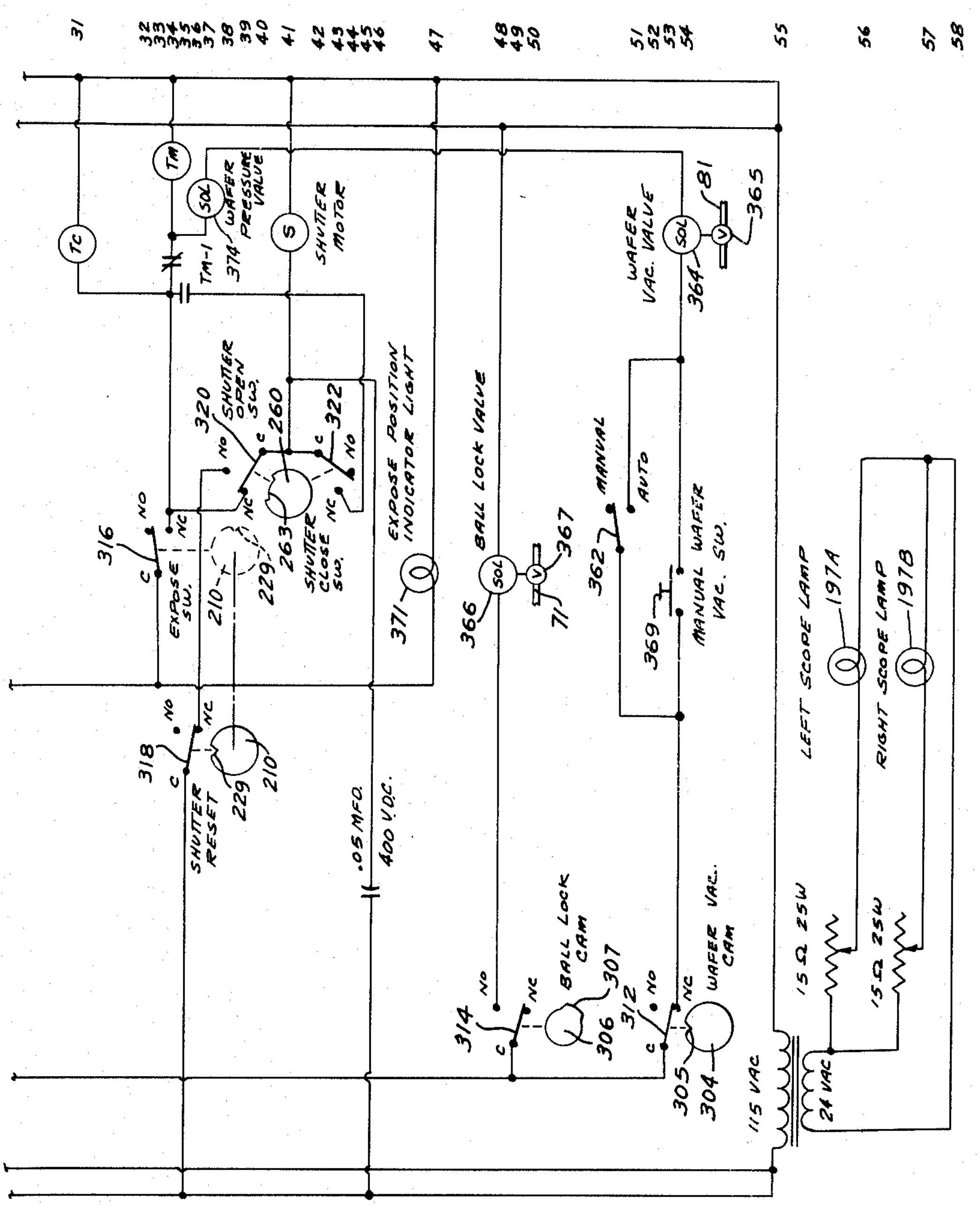

Referring now to the circuit diagram of FIGURES 29A and 29B, the mode of operation of the foregoing construction will now be explained in detail. All electrical circuit components are shown between 115-volt A.C. power lines L1–L2 in across-the-line schematic form. A marginal key has been employed in order to correlate the location of the various coils, contactors, switches and motors with the sequence of their operation. The various horizontal lines are identified with reference numerals in the right hand margin of the FIGURES 29A and 29B adjacent the power supply leads. Relays, motors and solenoid coils are indicated with encircled letters in the particular horizontal line. Relay contacts are designated with the same letter prefixes as the relay coils themselves bear. In addition, all relay contactors which are shown as being normally closed in the schematic will be identified with underlining in the specification. For example, normally open RS2–1 contacts in line 18 will have no underlining whereas the normally closed pair of <u>RS2–1</u> contacts in line <u>10</u> are underlined. All cams are shown in "start" or "load" position.

With 115 volts A.C. applied across the leads L1–L2, the operation is initiated by depressing "1st cycle" switch 360 (line 6) which is located on frame console 75. This shunts R2–2 contacts (line 5) which energizes relay R2 (line 5) so as to maintain the R2–2 contacts closed. R2–1 contacts (line 4) also close. However, the drive motor Z (lines 8 and 9) will have a D.C. applied to its field terminals from the 400 mfd. capacitor (line 2) through <u>R1–1</u> (line 7) and 7.5 mfd. capacitor (line 8) and will be braked at a stop position as a result of the D.C. charge from transformer 361 and diode 1N1199 line 2) being built up on the capacitors. The drive cam 286 will have been rotated to a stop wherein the roller will be resting at portion 286A in FIGURE 18. Drive crank 280 will be in its maximum clockwise pivoted position whereby the wedge 30 is at the bottom or front portion of the inclined plane trackway 20. This "start" position is shown in FIGURE 7 preparatory to loading the wafer W upon the chuck 70. The carriage 40 will have been drawn to the rear portion of the wedge by spring 37 into abutment with bumper 35. See FIGURE 4A.

The mask M, which has been preliminarily aligned within its holder 90 and held therein by clips 93 and 94 is inserted within the slideway 85 against the rear stop 99. The holder 90 is sucked up into contact with the reference roof of the slideway as a result of vacuum being constantly applied to the cannulae 86 and 87 through exhaust tubing 147 connected to a vacuum manifold in the console 75. The mask M will simultaneously be drawn into positive contact with the underface of the holder 90 by way of channel 96.

"Manual-Auto" switch 362 (line 51) is thrown to closed ("auto") position and energizes wafer vacuum solenoid 364 (line 54) through the closed contacts of microswitch 312 whose roller has fallen into V-notch 305 of wafer lock cam 304. Energizing the solenoid 364 actuates a valve 365 in 81 so as to cut off the vacuum to the chamber 76 under the foraminous insert 78. The wafer W is then placed upon the chuck disk 73 of ball 70 with the wafer edges abutting the three registration pins 148 which are urged upwardly by flat springs 149. Ball lock solenoid 366 (line 48) will be de-energized since microswitch 314 is open, the contactor roller engaging the "round" of cam 306. Accordingly, valve 367 in hose 71 is in "open" position to supply vacuum to the groove 68 in the ball chuck cup 67. The ball chuck 70 is therefore locked. It is to be observed that energizing of the solenoids 364 and 366 cuts off the vacuum to the respective hoses 81 and 71 whereas their de-energizing causes reduced pressure or vacuum to communicate with the respective hoses.

Footswitch 368 (line 27) which is located on the floor is momentarily depressed by the operator which opens the circuit to stepping relay RS1 (line 27) and permits the relay to reset. When the foot switch 368 is raised the circuit to stepper relay RS1 is closed through <u>R3–1</u> (normally closed), timer contacts <u>TC–2</u>, reset switch 370 (line 23) and drive motor microswitch 308 whose roller is depressed within notch 301 of cam 300. RS1–2 (line 4) and RS1–1 (line 23) contacts both close. Relay R1 (line 4) is energized through the now closed contacts of RS1–2 and R2–1. R1–1 (line 7) closes to supply power to the drive motor Z and R1–1 (line 7) opens to release the D.C. brake on the field. The motor Z turns the cam shaft 295 and hence rotates drive cam 286, as well as cams 300, 302, 304 and 306. The crank 280 pivots clockwise and draws the wedge 30 up the inclined plane 20 by spring 39. The crank 280 slows up slightly as its roller 287 engages first dwell depression 286B on the cam surface. This dwell occurs when the carriage abuts up against boss 109 on Y-positioner arm 102 of bracket 101 in micromanipulator E. At this stage, the carriage 40 is released from its spring 37 biased abutment with the bumper 35 on the wedge. The second slow up occurs when the carriage 40 is elevated on the wedge slider 30 so that the wafer W is gently urged into abutment with the mask M, that is, when follower 287 engages cam depression 286C.

As soon as the drive motor Z has begun to turn, the wafer vacuum cam 304 has rotated to position at which the microswitch 312 roller is elevated from the notch 305 and engages the "round" of the cam. This opens the circuit to the wafer vacuum solenoid 364 and immediately applies vacuum to chamber 76 and locks the wafer W to the surface of the foraminous insert 78. Simultaneously, the evacuated chamber 76 sucks the wafer registration pins 148 downwardly against the opposed bias of flat springs 149. Thus, the pins 148 are drawn below the surface of the chuck 70 in order to prevent their contacting the mask M as the wafer W is urged into abutment therewith.

Just before the wafer W has engaged the mask, the nose 307 of ball lock cam 306 has engaged the roller of microswitch 314 and closes the circuit to solenoid 366. Solenoid 366 closes the valve 367 and cut-off the vacuum to the tube 71 and hence to the groove 68. Air under slight pressure is fed to the groove 68 through hose fitting 72. Accordingly, the chuck 70 will ride freely in its universal joint cup 67 so as to align itself when the wafer W is urged into "align" position against the mask M and orient the abutting surfaces into a common interfacial plane. Immediately thereafter, the nose 307 of ball lock cam 306 passes beyond the contact roller of microswitch 314 so as to reopen the circuit to the ball lock solenoid 366. The ball 70 will be relocked into its self-aligned position within the chuck cup 67 since vacuum has been applied to the groove 68. Note that the crank 280 cannot draw the wedge 30 any further rearwardly than the point at which the wafer abuts the mask. However, the crank 280 is pivoted slightly further counterclockwise, as shown in FIGURE 18, the drive spring 39 stretching slightly as the roller 281 is moved out of abutment with the wedge rear surface 29.

The drive motor A will have rotated through approximately 135° when it is immediately braked to a half—i.e. when microswitch 308 has fallen into notch 301A of the drive motor cam 300. Stepper relay RS–1 is re-energized so as to open the previously closed RS1–1 and RS1–2 contacts in lines 23 and 4 respectively. Therefore, relay R1 now opens the previously closed R1–1 contacts in line 7 to cut-off the power to the motor Z. Also, the previously one R1–1 contacts in line 7 will re-close to apply the D.C. brake to the field windings. The "aligning" position wherein the surface of the wafer W has been urged into contact with the surface of the mask M is shown in FIGURE 8.

The shutter cam 302 will have rotated to a position at which the roller of microswitch 310 has fallen into the arcuate notch 303 whereby relay R3 (line 22) is energized. Contacts R3–1 (line 30) close to energize relay RS2 through the normally closed timer clutch contacts TC–1. RS2–1 contacts (line 19) close so that depressor motor J1 (line 21) is energized through microswitch 350. Depressor cam 347 immediately rotates to lift roller of microswitch 348 out of its notch and elevates its contacts to "NO" position. Cam 346 continues to rotate until roller of microswitch 350 falls into that notch to open the circuit to cam motor J1. This half revolution causes the rod 351 in FIGURE 25 to lower whereby the heel 326 of depressor foot 325 "finds" the surface 29 of wedge 30. Cam motor J2 is now energized through the "NC" position of microswitch 350 and the "NO" position of microswitch 344. Accordingly, the pulley 331 will be rotated by cable 332 whereby the eccentric drum 328 will drive the depressor foot 325 to the left, as shown in FIGURE 25, and move the wedge 30 a slight distance down the inclined plane 20. However, spring 37 will maintain the carriage 40 in biased abutment with the Y-positioner arm 102 of micromanipulator E. Therefore, the carriage 40 will be depressed slightly in a pure vertical path so that the surface of the wafer W is adjacently spaced from the surface of the mask M while the two surfaces are in parallel horizontal planes. When the cam 340 has rotated through one-half of a revolution, roller of microswitch 344 falls into its V-notch and elevates the contacts into "NC" position thereby immediately stopping the J2 motor. The spaced position of the wafer W with the mask M is shown in FIGURE 9. All surface aligning operations have thus far been performed automatically with the actuation of the foot switch 368.

Figure 9A:
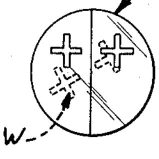
FIGURE 9A is a plan view of the wafer and mask patterns under magnification through a split-image microscope.

The two patterns which are clamped in spaced parallel planes are now brought into registration with each other by micromanipulator E, which orients the wafer W along X- and Y-axes through the finger piece 139 and shoe 140 sliding on shelf 145, and rotary positioner 60 which orients the chuck 70 about a polar axis. This is observed under magnification through the microscope 150, as shown in FIGURE 9A. Note that the microscope 150 is scanned over the mask M by chessman slider 160 so as to find the minute patterns.

When the registration of the two patterns has been completed, the foot switch 368 is again momentarily depressed and then permitted to close. The RS2–2 relay (line 30) is now energized through the closed R3–1 contacts and the timer clutch contacts TC–1. This will now step all of the RS–2 contacts again, noting that they have been previously stepped by the actuation of relay R3 through the shutter cam 302. All RS–2 contacts are now back in the position in which they are shown in FIGURE 29. However, it is to be observed that the second depression of the foot switch 368 does not energize the drive motor Z since the circuit to relay RS–1 is open—i.e. R3–1 (line 27) is now open. The depressor motor J2 will be re-energized through the microswitch 342, which is now in "NO" position, and RS2–1 contacts (line 10) now in normally closed position so as to be coupled back to the line L1 through line 18. Cam 340 will rotate thereby turning pulley 331 and eccentric drum 328 until the depressor foot 325 is moved to the right as shown in FIGURE 25. The depressor motor J2 will stop when the notch in cam 340 is engaged by the roller of microscope 342. Now, the cam motor J1 is re-energized through the "NO" position of cam switch 348, the "NC" position of cam switch 342 and back to L1 through the now closed RS2–1 contacts. Cam 346 will rotate one-half revolution until the microswitch 348 engages the notch in the cam and falls back into "NC" position thus again opening the circuit to the cam motor J1. During the half revolution of cam motor J1, the rod 351 and nut 355 have lifted the tube 354 so as to raise the depressor foot 325 in a clockwise direction. Since the heel 326 is no longer in engagement with the rear surface 29 of the wedge 30, the wedge will move slightly to the right again and cause the wafer W to elevate in a pure vertical path into abutment with the mask. The two patterns remain verified. Positioner lock solenoid 372 is also energized at this point to vacuum clamp the shoe 140 to shelf 145.

The hand crank 200 is now pulled forwardly whereby the microscope 150 is swung out of scanning position and the turret 210 is rotated so that the fan 202 is swung into position. The roller of "expose" microswitch 316 has now fallen into the V-notch 229 in the surface of the turret 210, the "reset" microswitch 318 now being in "NO" position. Expose position indicator lamp 371 is now lit through the now closed R3–3 contacts (line 28), through microswitch 342 which is at "NC" position and through the normally closed RS2–2 contacts back to line L1. The timer motor TM (line 34) and the timer clutch TC (line 31) are both energized through the TM–1 contacts, the "NC" position of the expose microswitch 316 and back to L1 through microswitch 342 and RS2–2. The shutter motor S (line 41) will be energized through the shutter open switch 320 which is now in "NC" position and coupled back to the line through the now closed expose switch 316. Accordingly, the shutter 260 will rotate one full revolution and drive the shutter 260 so that the space between blade 256 and blade 257 is now opposite the projection tube 251. That is, the Geneva wheel 272 is rotated 60° by the drive wheel 275. The motor S stops when roller of microswitch 320 engages the lip 262 and has moved to "NO" position. When this has occurred, microswitch 322 has fallen into "NC" position since its roller has now engaged the depression 263.

In the meantime, the timer motor TM has begun to run and its pointer will turn as it is carried about by the timer clutch TC. When the preset time has expired (0–15 seconds), the pointer will abut against the TM–1 contacts and cause them to reverse. TM–1 (line 34) opens and TM–1 (line 35) closes. The shutter motor S will be actuated at the completion of the exposure cycle through microswitch 322, which is in "NC" position back through TM–1 (line 35) and the "expose" microswitch 316 (line 34), which is in "NC" position, to line L1 as before. The shutter 260 will be turned by the Geneva drive wheel 270 until the blade 257 is interposed directly in the path of the light beam. When the shutter 260 has been turned through 60°, the "shutter close" microswitch 322 engages the camming lip 262 of the shutter and is returned to "NO" position to fully de-energize the shutter motor S after the second one full revolution. It is to be observed that the trailing edge of the blade 256 always opens the shutter from the same side and the blade 257 always closes the shutter from the same side. It is also to be noted that a D.C. brake is applied to the shutter motor S through the .05 mfd. condenser (line 46) to bring the motor immediately to a halt when its A.C. power is cut off.

Now, finally, it is to be noted that the TM–2 contacts (line 29) also close when the timer TM has completed its cycle. Therefore, the stepper relay RS–1 (line 27) is now energized through microswitch 308 (in "NC" position since roller is in notch 301A), through reset switch 370, the now closed TM–2 contacts, and closed R3–2 contacts back to L1. Therefore, the drive motor Z will begin to turn again automatically since RS1–2 (line 3) has energized relay R1 (line 4), and relay R1 has reversed its R1–1 and R1–1 contacts in line 7. The cams 286, and all switch cams 300, 302, 304, and 306 will rotate clockwise again until drive motor cam notch 301 depresses the microswitch 308 to "NC" position again. The following automatic sequence of operations occurs in bringing everything back to "unload" position:

Crank 280 pivots counterclockwise so that roller 281 drives the wedge 30 down the inclined plane and in doing so retracts the carriage 40. Wafer W is withdrawn from contact with the mask M. When the wedge 30 is sufficiently retracted, the carriage will move away from abutment with the Y-positioner 102, and abut the bumper 35 as a result of the spring 37 bias. Finally, both the wedge 30 and the carriage 40 are in the position shown in FIGURE 7. Since the wafer cam 304 is in start position, the roller of microswitch 312 has fallen into notch 315 so that vacuum is cut off. The wafer just exposed can now be removed and a new wafer inserted for a new sequence of operations.

Rotating the hand crank 200 swings the microscope 150 back into scanning position and the exposure lamp assembly G out of the way. The shutter reset microswitch 318 is returned to "NC" position and supplies power to the shutter motor S through microswitch 320 which is at "NO" position. The shutter motor S will continue to rotate until microswitch 320 roller falls into slot 263. Shutter blade 256 is now interposed in the turret 210 preparatory to the next exposure cycle. Lastly, since expose switch 316 is now in "NO" position, both the timer clutch coil TC and the timer motor TM are both de-energized. Therefore, the timer will be automatically reset for the next exposure cycle of the new wafer.

Although this invention has been described in considerable detail, such description is intended as being illustrative rather than limiting since the invention may be variously embodied, and the scope of the invention is to be determined as claimed.

What is claimed is:

1. A contact printing alignment fixture for precisely orienting a pattern of geometric indicia on a mask with respect to geometric indicia on the surface of a semiconductor wafer comprising a frame, means constituting an inclined plane in said frame, a wedge plate slidable on said inclined plane, a work stage slidable in a horizontal plane on said wedge plate, a turntable rotatable in said work stage, a wafer chuck, means constituting a universal joint supporting said chuck in said turntable, a holder supporting the mask in said frame above said wafer chuck, means to drive said wedge plate up said inclined plane until the upper surface of a wafer held on said chuck is pressed into abutment with the mask, means to lock said universal joint means in the configuration assumed as a result of abutment of the surface of the water with that of the mask whereby the opposed abutting surfaces thereof are maintained in parallel planes, means to drive said wedge plate down said inclined plane a predetermined small distance so as to adjacently space the parallel planes of the lower surface of said mask and the upper surface of said wafer, means to manipulate said work stage until the indicia on the wafer surface precisely registers with the mask indicia pattern, and means to drive said wedge plate up the said inclined plane and at the same time restricting all horizontal movement of said work stage with respect to said mask so that the surface of the wafer will re-abut the mask in precise alignment therewith preparatory to photographic exposure.

2. A contact printing alignment fixtures for precisely orienting a pattern of geometric indicia on a mask on the surface of a semiconductor comprising: a frame, means constituting an inclined plane trackway in said frame, means supporting the mask in said frame above the inclined plane trackway, a slider reciprocable in said trackway, a wafer chuck, means constituting a universal joint supporting said chuck on said slider, means to pull said slider up said trackway until a wafer supported in said chuck is urged into face-to-face abutment with the mask whereby the universal joint orients itself and causes the abutting surfaces to be urged into parallel planes, means to lock the universal joint, depressor means to push said slider a small predetermined distance down the trackway so that said wafer in said chuck is adjacently spaced from the mask with the spaced surfaces aligned in parallel planes whereby the patterns can be manipulated into registration with each other preparatory to contact printing.

3. The invention of claim 2 including a plurality of registration pins vertically slidable in said chuck and rectilinearly spaced from each other to define X- and Y-reference axes on said chuck for preliminary aligning the wafer therein, resilient means urging said pins above the surface of said chuck when the wafer is being loaded therein, foraminous means on said chuck having a chamber whereby the wafer is vacuum-clamped upon said chuck and said pins are sucked downwardly below the surface of said chuck against the bias of said resilient means.

4. The invention of claim 2 wherein the universal joint comprises a cup having a concave hemispherical surface, and a convex hemispherical surface on the bottom of said chuck in complementary slidable engagement with the concave hemispherical surface.

5. The invention of claim 4 including a groove in said cup, means to introduce air under pressure to said groove whereby said convex hemispherical surface will float in said convex surface on an air stream film therebetween when said wafer and mask surfaces are urged into abutment.

6. The invention of claim 5 wherein said universal joint lock means comprises means to evacuate said groove after said abutting mask and wafer surfaces have been urged into parallel planes.

7. A contact printing alignment fixture for precisely orienting a pattern of geometric indicia on a mask with respect to geometric indicia on the surface of a semiconductor wafer comprising: a frame, means constituting an inclined plane in said frame, a wedge plate slidably reciprocable on said inclined plane, a carriage slidable in a horizontal plane on said wedge plate, a wafer chuck, means constituting a universal joint supporting said chuck in said carriage, a holder supporting the mask in said frame above said wafer chuck, means to drive said wedge plate up said inclined plane until the upper surface of a wafer held on said chuck is pressed into abutment with the mask so as to cause said universal joint to self-align whereby the opposed abutting surfaces thereof are oriented in parallel planes, depressor means to drive said wedge plate down said inclined plane a predetermined small distance so as to adjacently space the parallel surface planes of said mask and said wafer, a microscope disposed in said frame above said mask for observing the spaced geometric patterns under magnification, means to manipulate said carriage in a horizontal plane about rectilinear and polar axes until the indicia on the wafer surface precisely registers with the mask indicia pattern, and means to release said depressor means whereby said carriage will be elevated in a pure vertical path and urge the registered patterns into abutment with each other preparatory to photographic exposure.

8. The invention of claim 7 wherein said depressor means comprises a foot rotatably supported about a horizontal axis at its proximal end and having an arcuate heel at its distal end adapted to abut an inclined surface at a rear portion of said wedge plate, means to pivot said foot until said heel finds the rear surface of said wedge plate, and eccentric means to move said foot toward said wedge plate when said heel is in abutment with the rear surface thereof.

9. The invention of claim 8 wherein said means to pivot said foot comprises a tube hingedly supported on said foot and downwardly depending therefrom, a rod slidably received in said tube and having a shoulder in detachable abutment with the lower end thereof, a crank coupled to the lower end of said rod, a motor for turning said crank, and means to actuate said motor through one-half of a cycle of revolution whereby said shoulder will be withdrawn from abutment with said tube.

10. The invention of claim 9 wherein a second motor is coupled to said eccentric means and means to actuate said second motor through one-half of a cycle of revolution.

11. The invention of claim 10 including means to actuate in sequence said second motor through the second half of its cycle of revolution and then said first motor through the second half of its cycle of revolution whereby said heel will be retracted but yet in touching engagement with said wedge plate and then said shoulder will re-abut the lower end of said tube to pivot said foot out of the way.

12. A contact printing alignment fixture for precisely orienting a pattern of geometric indicia on a mask with respect to geometric indicia on the surface of a semiconductor wafer comprising: a frame, a wafer chuck reciprocable in said frame, a holder supporting the mask in said frame, means to move said wafer chuck toward said mask so that the surface of the wafer is urged into abutment with the surface of said mask, a turret in said frame, said turret having an aperture therein, lamp means in said frame for directing a collimated beam of light through said aperture so as to impinge upon the mask and expose a photosensitive coating in the surface of the wafer, a shutter rotatably supported within said turret and having a pair of circumferentially spaced blades being normally in line with the aperture so as to intercept the beam of light, means to rotate said shutter in one direction so that said first blade moves past said aperture and allows the beam of light to pass therethrough, and means to rotate said shutter again in the same direction after a predetermined interval of time until said second blade is in line with said aperture and intercepts the beam of light whereby the photosensitive surface is uniformly exposed.

13. The invention of claim 12 wherein said shutter moving means comprises a Geneva drive, a motor coupled with said Geneva drive, actuating means to turn said motor through a single full revolution whereby said shutter will move through an arc sufficient to open the aperture, and timer means to actuate said motor through a second single full revolution whereby said shutter will move through a second arc sufficient to close the aperture.

14. The invention of claim 13 wherein said turret is rotatable in said frame, means to revolve said turret into expose position and into a position at which the light beam is intercepted by the turret itself, said means to revolve said turret automatically tripping said situating means and said timer means when said turret is moved to the expose position.

15. The invention of claim 14 wherein said means to revolve said turret automatically actuates said motor a third time when said turret is returned to the position at which the beam of light is intercepted, said third actuation of said motor causing said shutter to move through a third arc whereby said first blade is returned to the initial position at which the light beam is intercepted.

No references cited.

EVON C. BLUNK, *Primary Examiner.*